US010015026B2

(12) United States Patent
Owa

(10) Patent No.: US 10,015,026 B2
(45) Date of Patent: Jul. 3, 2018

(54) TRANSMITTER AND COMMUNICATION SYSTEM

(71) Applicant: Sony Corporation, Tokyo (JP)

(72) Inventor: Hisashi Owa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/507,427

(22) PCT Filed: Sep. 25, 2015

(86) PCT No.: PCT/JP2015/077071
§ 371 (c)(1),
(2) Date: Feb. 28, 2017

(87) PCT Pub. No.: WO2016/059957
PCT Pub. Date: Apr. 21, 2016

(65) Prior Publication Data
US 2017/0288920 A1 Oct. 5, 2017

(30) Foreign Application Priority Data
Oct. 16, 2014 (JP) ................................. 2014-211464

(51) Int. Cl.
H04L 25/493 (2006.01)
H04L 25/02 (2006.01)
(Continued)

(52) U.S. Cl.
CPC ... H04L 25/493 (2013.01); H03K 19/017509 (2013.01); H04L 25/028 (2013.01); H04L 25/4917 (2013.01)

(58) Field of Classification Search
CPC ....... H03K 19/00307; H03K 19/00315; H03K 19/00353; H03K 19/00361;
(Continued)

(56) References Cited

U.S. PATENT DOCUMENTS 8,222,954 B1 * 7/2012 Ren ................... H03K 19/00369
323/312
2003/0197696 A1 * 10/2003 Onozawa ............... G09G 3/296
345/212
(Continued)

FOREIGN PATENT DOCUMENTS

JP 2005-318264 A 11/2005
JP 2010-520715 A 6/2010
(Continued)

Primary Examiner — Young T Tse
(74) Attorney, Agent, or Firm — Michael Best & Friedrich LLP

(57) ABSTRACT

A transmitter according to the disclosure includes: three first driver sections; three first pre-driver sections that are provided corresponding to the respective three first driver sections, and each drive corresponding one of the first driver sections on a basis of corresponding one of three first control signals that are different from one another and each including predetermined number of signals; a second pre-driver section that operates on a basis of a second control signal that includes predetermined number of signals; and a controller that controls transition of the predetermined number of signals included in the second control signal to allow number of signals to be subjected to the transition out of the plurality of signals included in the three first control signals and the plurality of signals included in the second control signal to be same between timings of the transition.

16 Claims, 26 Drawing Sheets

(51) Int. Cl.
*H04L 25/49* (2006.01)
*H03K 19/0175* (2006.01)

(58) Field of Classification Search
CPC ....... H03K 19/0175; H03K 19/017509; H03K 19/017518; H03K 19/01806; H03K 19/01507; H03K 19/018521; H04L 25/026; H04L 25/0264; H04L 25/0272; H04L 25/028; H04L 25/0286; H04L 25/49; H04L 25/4917; H04L 25/4927; H04L 25/493
USPC ........ 375/219, 220, 222, 224, 257, 286–288
See application file for complete search history.

(56) References Cited

U.S. PATENT DOCUMENTS

2010/0308860 A1* 12/2010 Kim ..................... H03K 17/164
 326/27
2011/0012646 A1* 1/2011 Yadav ............... H03K 19/01852
 327/109
2012/0014025 A1* 1/2012 Sato .......................... H03F 1/52
 361/93.1
2015/0214928 A1* 7/2015 Vashishtha ........... H03K 17/687
 327/108

FOREIGN PATENT DOCUMENTS

JP 2011-517159 A 5/2011
JP 2012-213153 A 11/2012

* cited by examiner

[ FIG. 1 ]
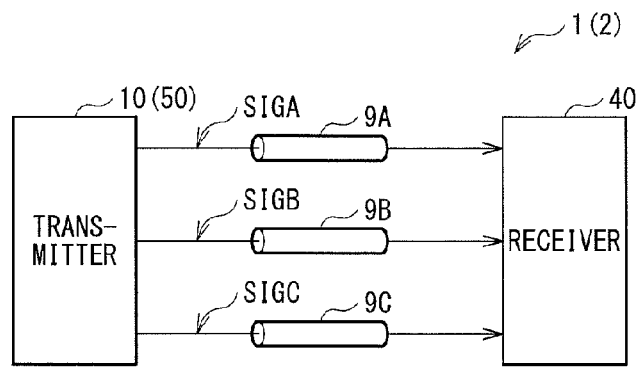
[ FIG. 2 ]
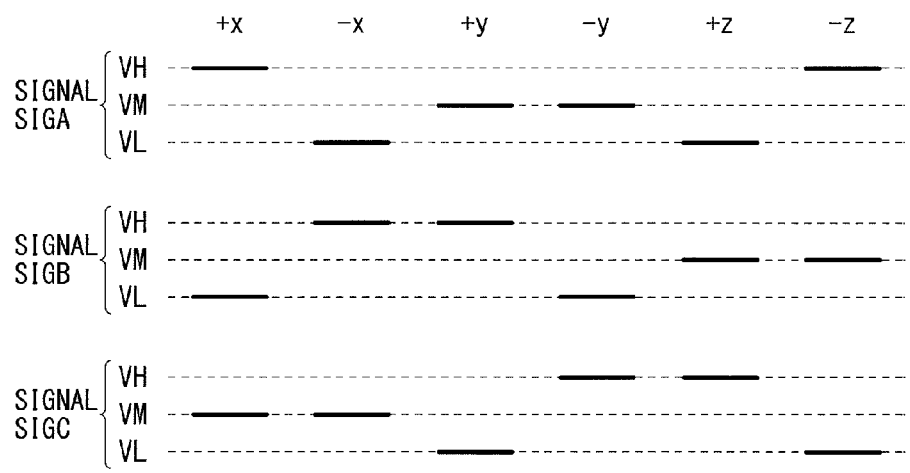

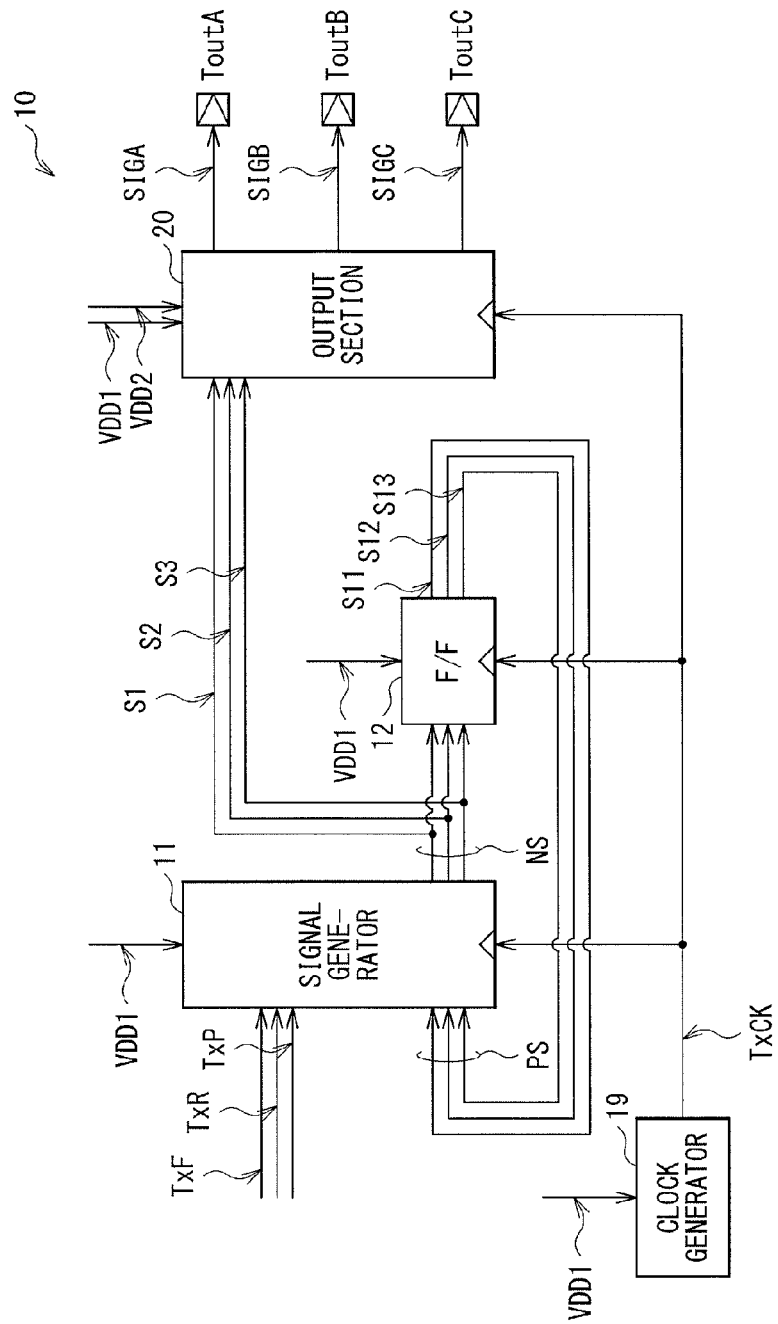
[FIG. 3]

[ FIG. 4 ]
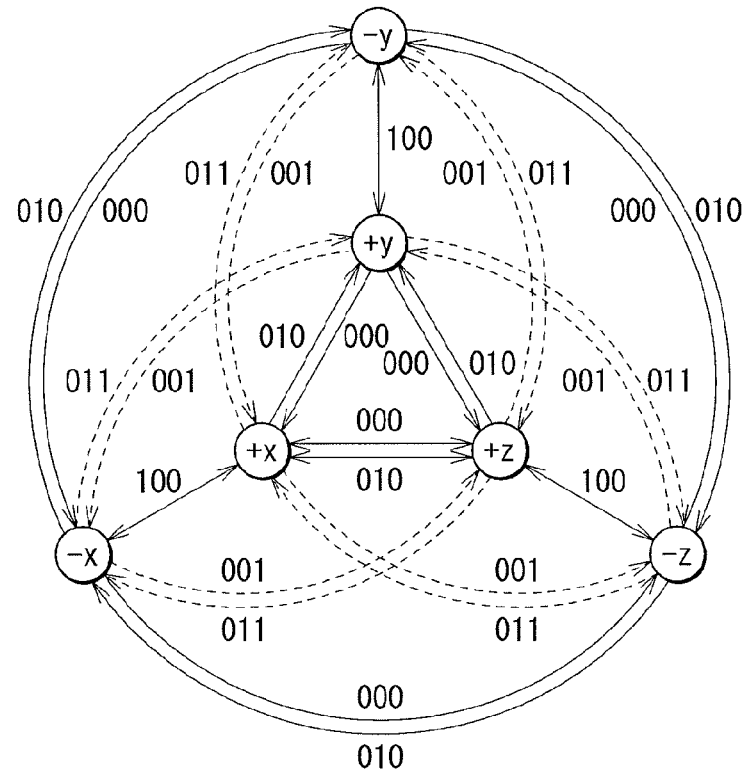
[ FIG. 5 ]
| SYMBOL NS (PS) | SIGNAL S1 (S11) | SIGNAL S2 (S12) | SIGNAL S3 (S13) |
|---|---|---|---|
| +x | 1 | 0 | 0 |
| -x | 0 | 1 | 1 |
| +y | 0 | 1 | 0 |
| -y | 1 | 0 | 1 |
| +z | 0 | 0 | 1 |
| -z | 1 | 1 | 0 |

[ FIG. 6 ]
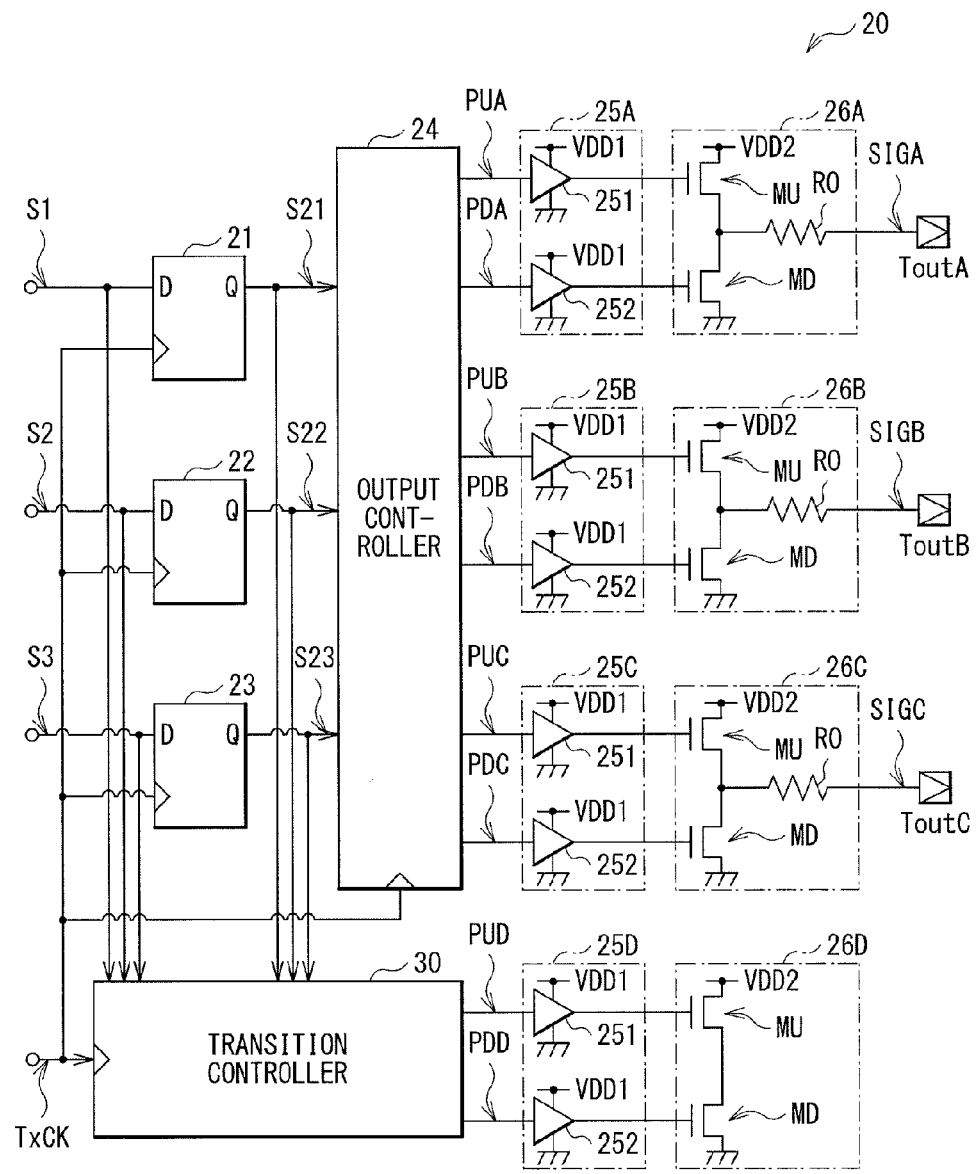

[ FIG. 7 ]

| SYMBOL | SIGNAL S21 | SIGNAL S22 | SIGNAL S23 | SIGNAL PUA | SIGNAL PDA | SIGNAL PUB | SIGNAL PDB | SIGNAL PUC | SIGNAL PDC | SIGNAL SIGA | SIGNAL SIGB | SIGNAL SIGC |
|---|---|---|---|---|---|---|---|---|---|---|---|---|
| +x | 1 | 0 | 0 | 1 | 0 | 0 | 1 | 0 | 0 | VH | VL | VM |
| -x | 0 | 1 | 1 | 0 | 1 | 1 | 0 | 0 | 0 | VL | VH | VM |
| +y | 0 | 1 | 0 | 0 | 0 | 1 | 0 | 0 | 1 | VM | VH | VL |
| -y | 1 | 0 | 1 | 0 | 0 | 0 | 1 | 1 | 0 | VM | VL | VH |
| +z | 0 | 0 | 1 | 0 | 1 | 0 | 0 | 1 | 0 | VL | VM | VH |
| -z | 1 | 1 | 0 | 1 | 0 | 0 | 0 | 0 | 1 | VH | VM | VL |

[FIG. 8]
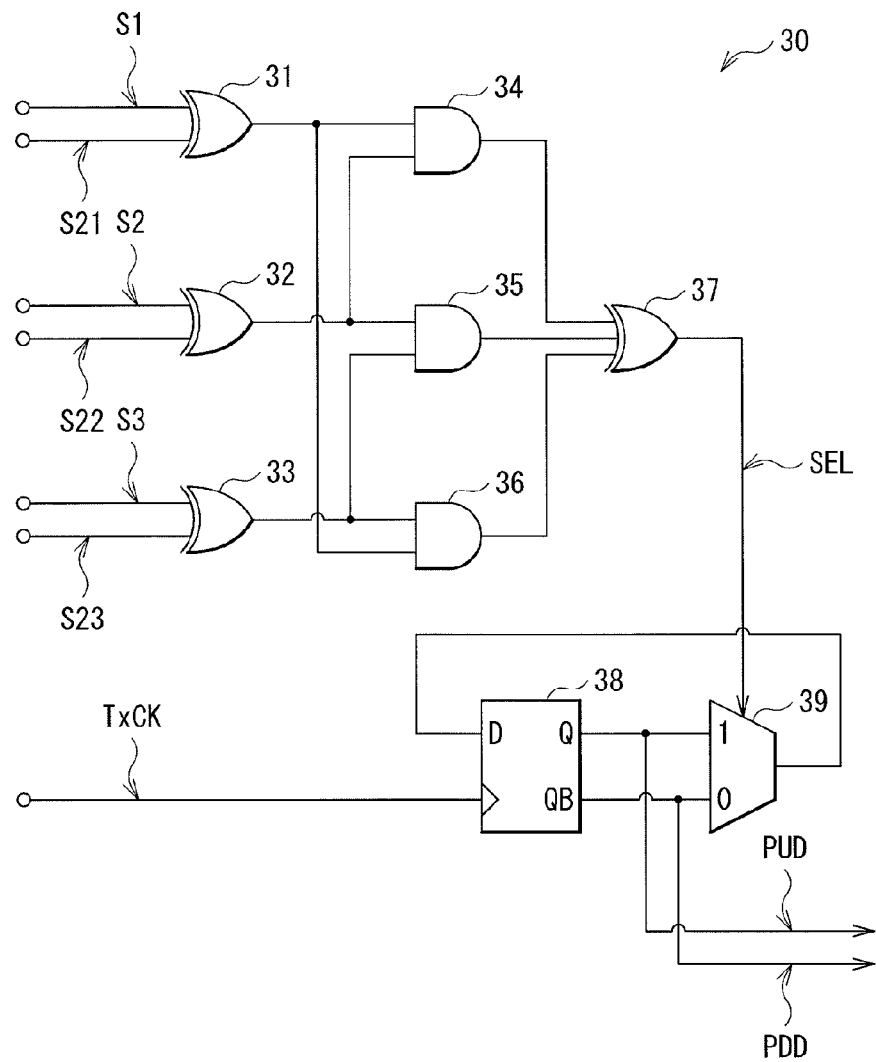

[ FIG. 9 ]

| SIGNAL S21 | SIGNAL S22 | SIGNAL S23 | SIGNAL SEL | SIGNAL PUD | SIGNAL PDD |
|---|---|---|---|---|---|
|  |  |  | 0 | O | O |
|  |  | O | 0 | O | O |
|  | O |  | 0 | O | O |
|  | O | O | 1 |  |  |
| O |  |  | 0 | O | O |
| O |  | O | 1 |  |  |
| O | O |  | 1 |  |  |
| O | O | O | 1 |  |  |

[ FIG. 10 ]
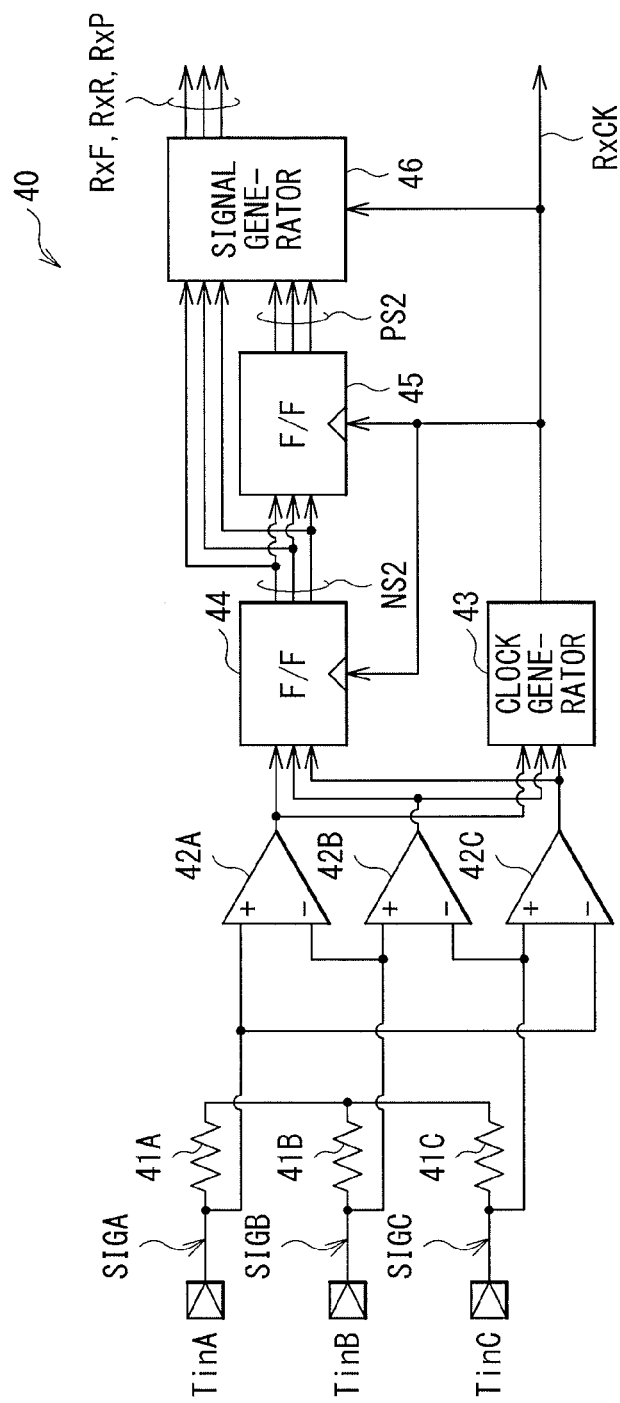

[ FIG. 11 ]
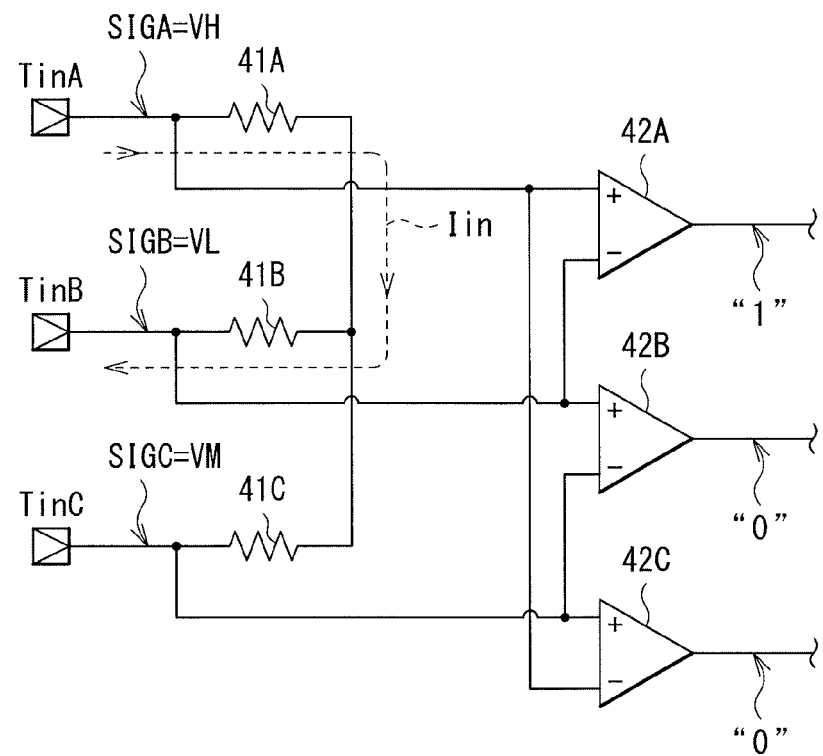

[ FIG. 12 ]
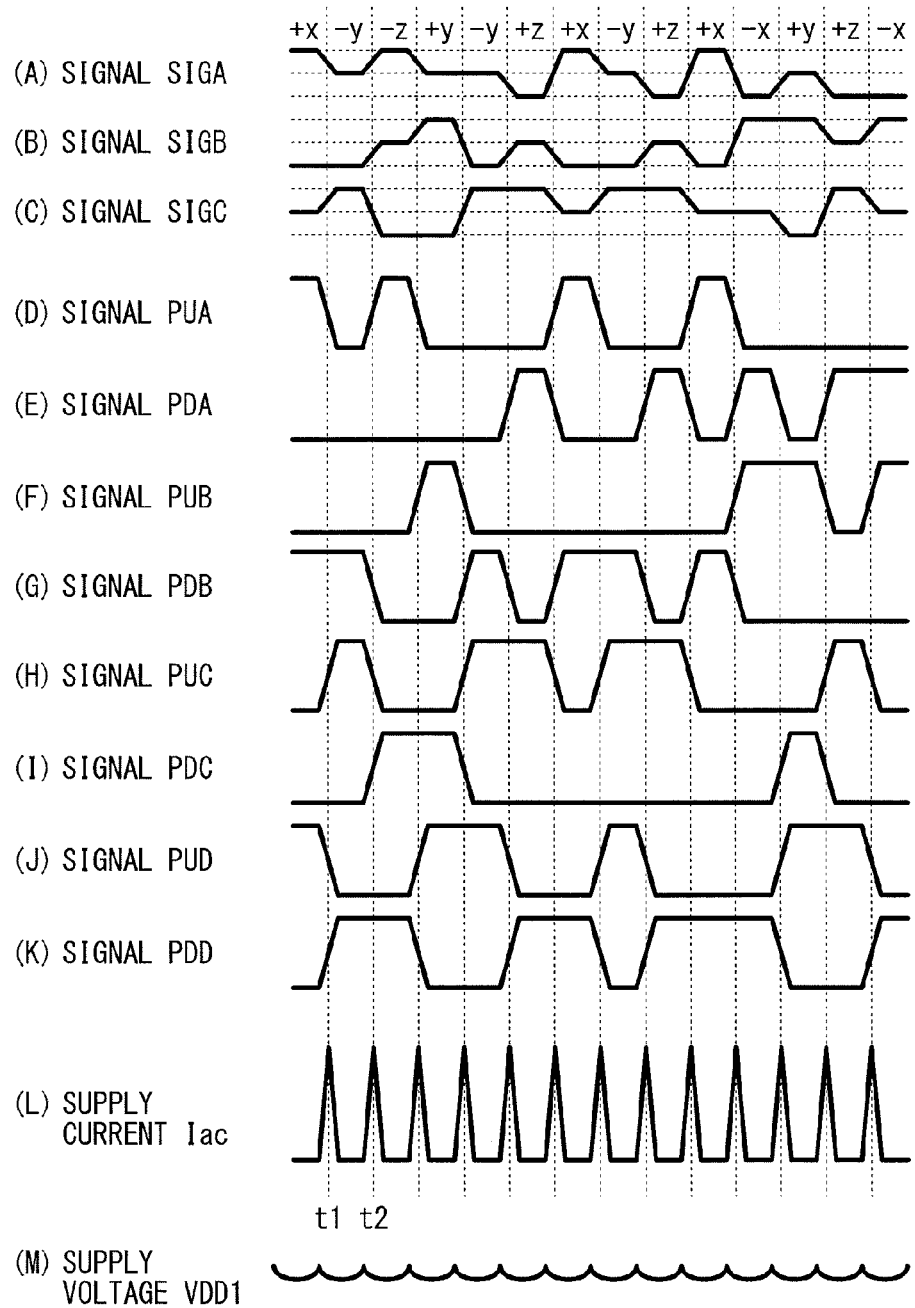

[ FIG. 13 ]

| TRANSITION OF SYMBOLS | SIGNAL S21 | SIGNAL S22 | SIGNAL S23 | N1 | SIGNAL PUA | SIGNAL PDA | SIGNAL PUB | SIGNAL PDB | SIGNAL PUC | SIGNAL PDC | SIGNAL PUD | SIGNAL PDD | N2 |
|---|---|---|---|---|---|---|---|---|---|---|---|---|---|
| +x↔-x | O | O | O | 3 | O | O | O | O | | | | | 4 |
| +x↔+y | O | O | | 2 | O | | O | O | | | | | 4 |
| +x↔-y | | | O | 1 | O | O | | | O | | | | 4 |
| +x↔+z | O | | O | 2 | O | | | | O | | O | O | 4 |
| +x↔-z | | O | | 1 | | O | | O | | O | O | O | 4 |
| -x↔+y | O | | | 1 | | O | | O | | | O | O | 4 |
| -x↔-y | | O | O | 2 | | O | O | | O | | | | 4 |
| -x↔+z | | O | O | 1 | O | | O | | | O | | | 4 |
| -x↔-z | O | O | | 2 | | O | O | O | O | O | | | 4 |
| +y↔-y | O | O | O | 3 | O | | O | O | O | O | | | 4 |
| +y↔+z | | | | 2 | | O | O | | | | O | O | 4 |
| +y↔-z | O | | | 1 | O | O | | O | O | | | | 4 |
| -y↔+z | O | | | 1 | | O | | | | | O | | 4 |
| -y↔-z | | O | O | 2 | O | | | O | O | O | | | 4 |
| +z↔-z | O | O | O | 3 | O | O | | | O | O | | | 4 |

[ FIG. 14 ]
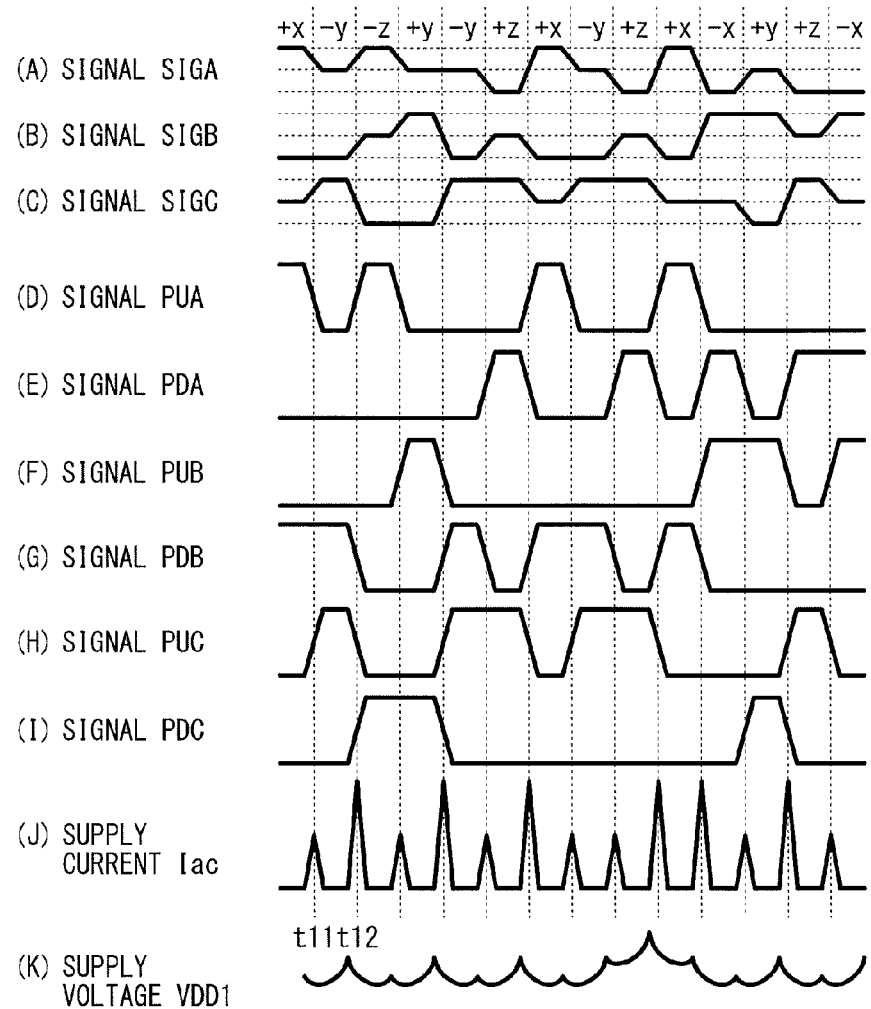

[ FIG. 15 ]

| TRANSITION OF SYMBOLS | SIGNAL S21 | SIGNAL S22 | SIGNAL S23 | N1 | SIGNAL PUA | SIGNAL PDA | SIGNAL PUB | SIGNAL PDB | SIGNAL PUC | SIGNAL PDC | N3 |
|---|---|---|---|---|---|---|---|---|---|---|---|
| +x↔-x | O | O | O | 3 | O | O | O | O |   |   | 4 |
| +x↔+y | O | O |   | 2 | O |   | O | O |   | O | 4 |
| +x↔-y |   |   | O | 1 | O |   |   |   | O |   | 2 |
| +x↔+z | O |   | O | 2 | O | O |   | O | O |   | 4 |
| +x↔-z |   | O |   | 1 |   |   |   | O |   | O | 2 |
| -x↔+y |   |   | O | 1 |   | O |   | O |   | O | 2 |
| -x↔-y | O | O |   | 2 |   | O | O |   | O |   | 4 |
| -x↔+z |   | O |   | 1 |   |   | O |   | O |   | 2 |
| -x↔-z | O | O | O | 2 | O | O | O | O | O | O | 4 |
| +y↔-y |   |   | O | 3 |   |   | O |   | O | O | 4 |
| +y↔+z | O |   |   | 2 | O | O | O | O | O | O | 4 |
| +y↔-z | O |   | O | 1 |   |   | O | O |   |   | 2 |
| -y↔+z |   | O | O | 1 | O | O |   |   |   |   | 2 |
| -y↔-z | O | O | O | 2 | O |   |   |   | O | O | 4 |
| +z↔-z |   | O | O | 3 | O | O |   |   | O | O | 4 |

[ FIG. 16 ]
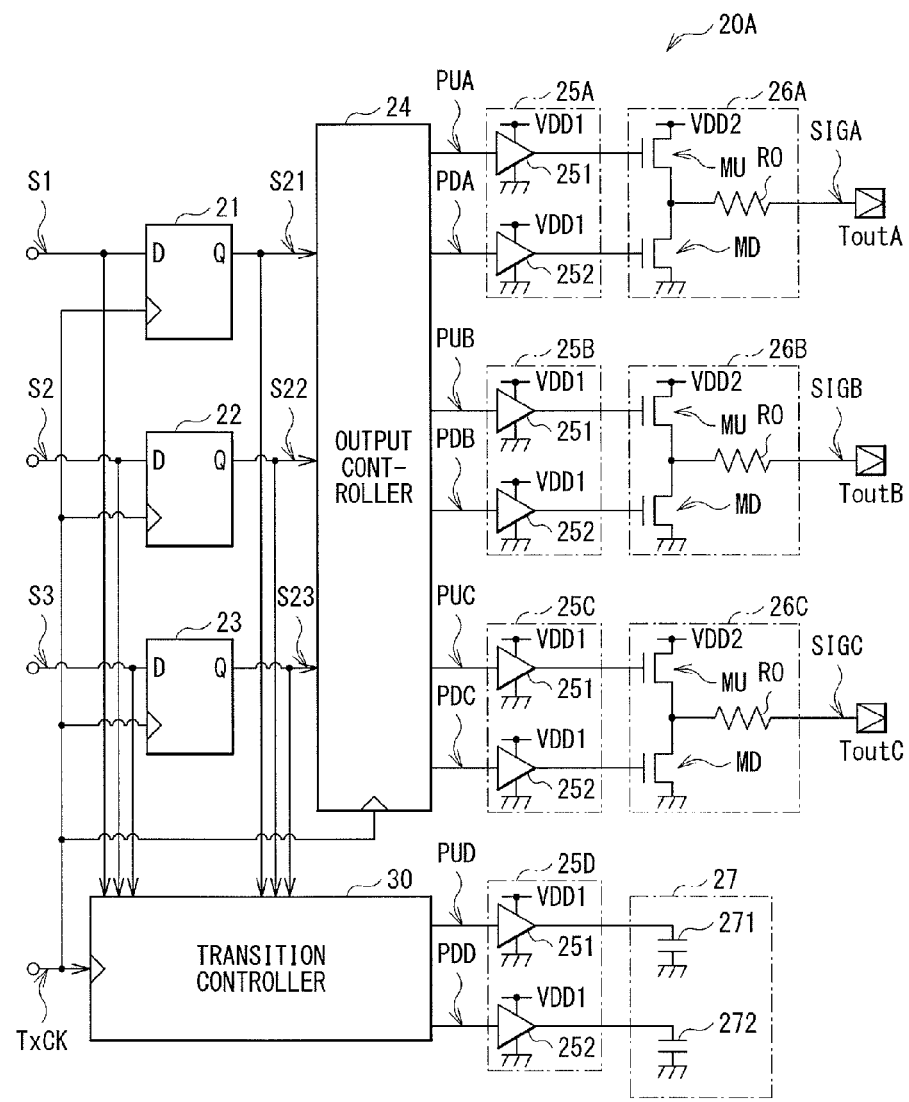

[ FIG. 17 ]
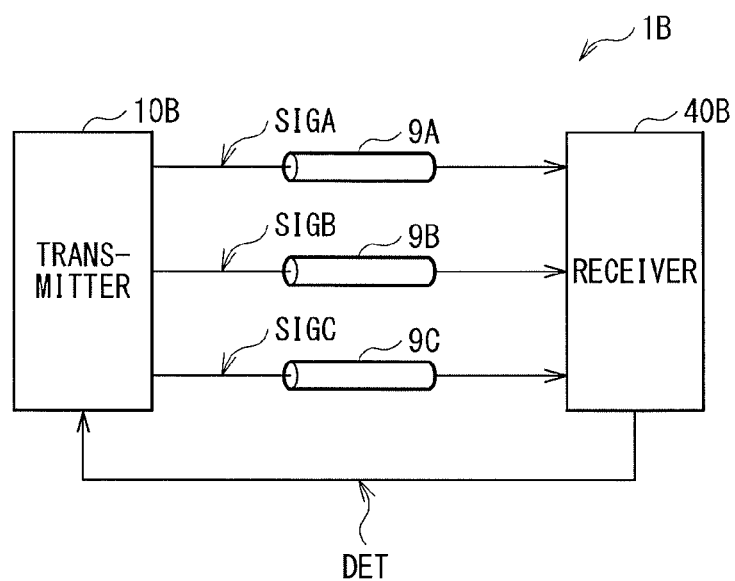

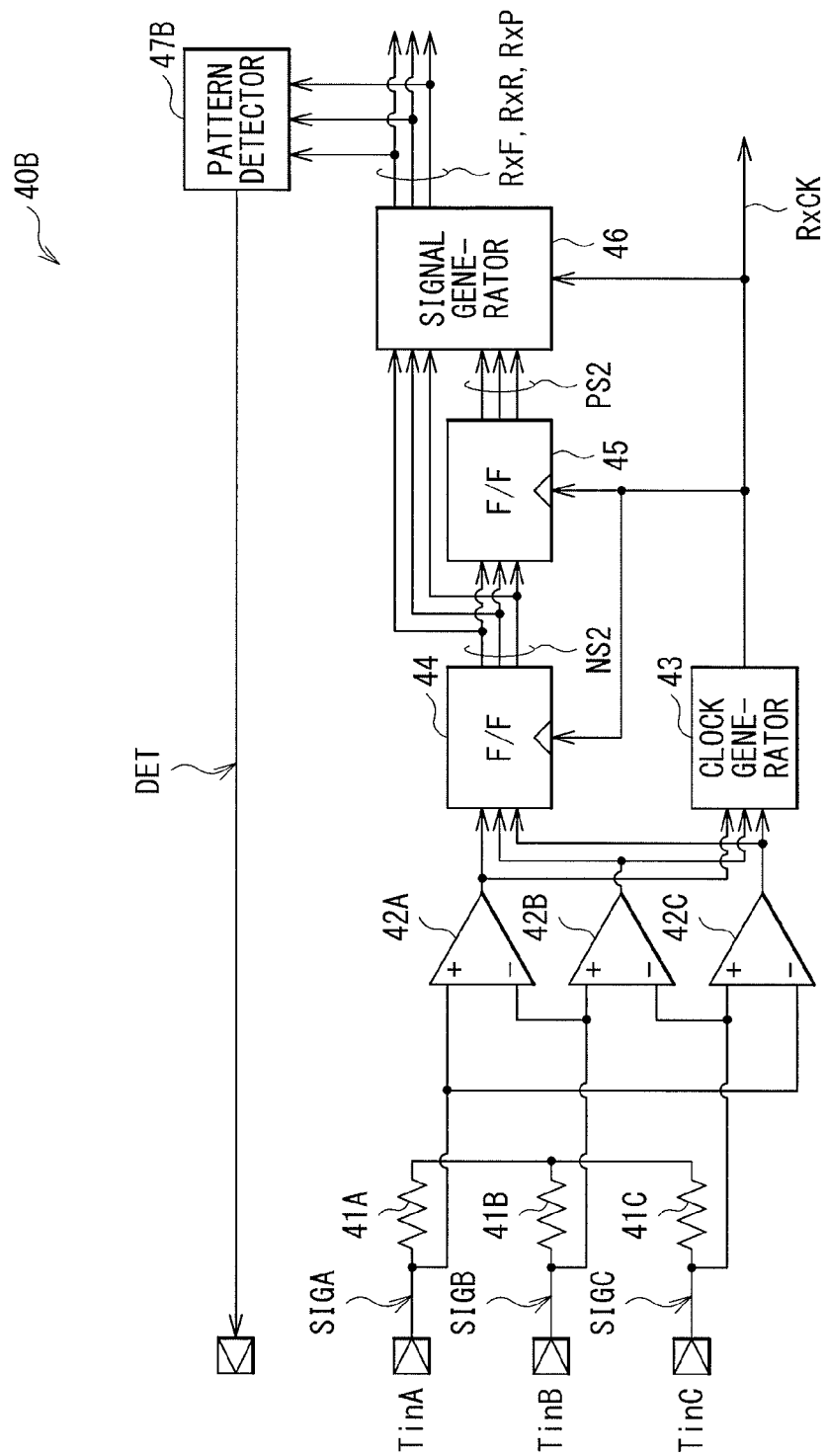
[FIG. 18]

[FIG. 19]
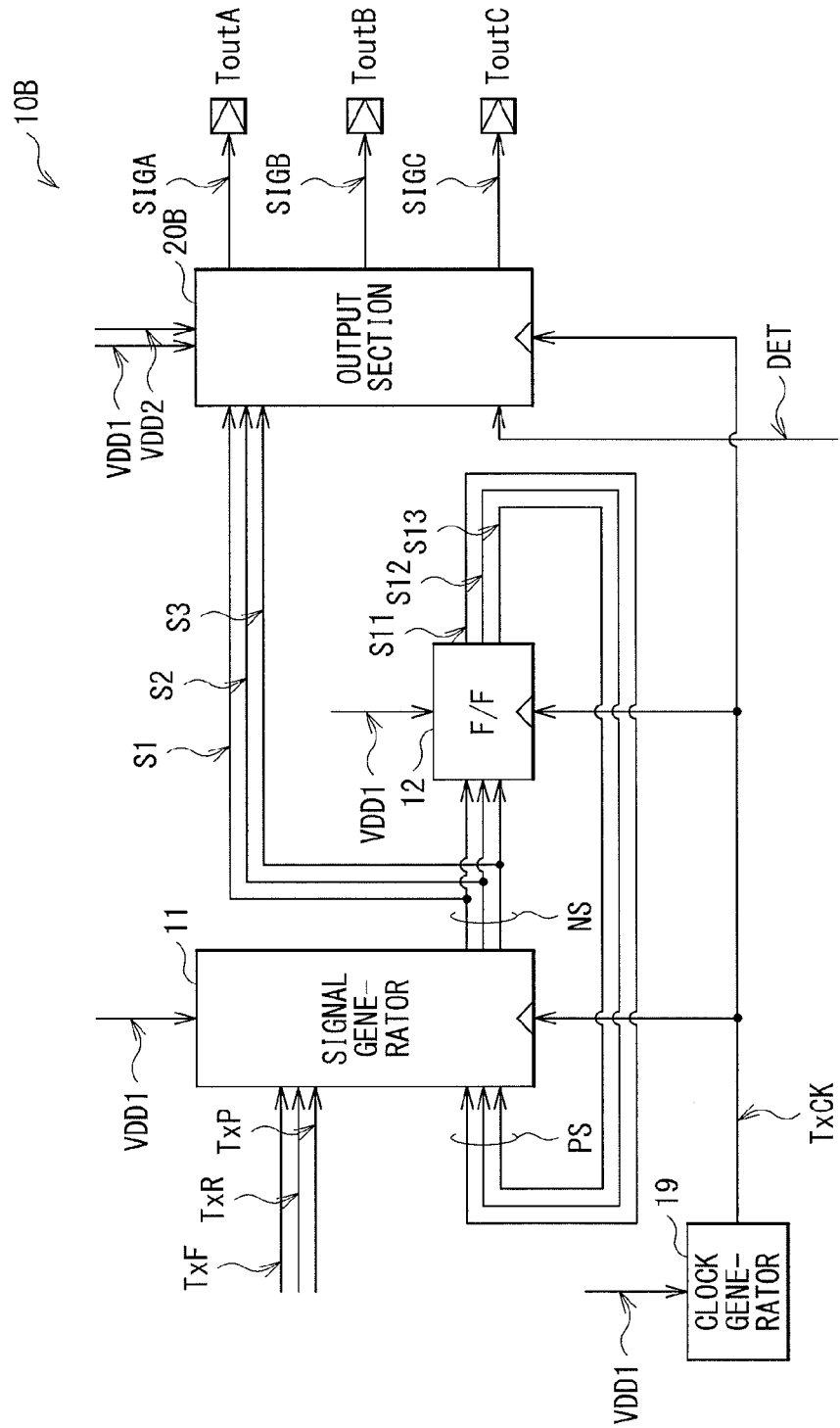

[FIG. 20]
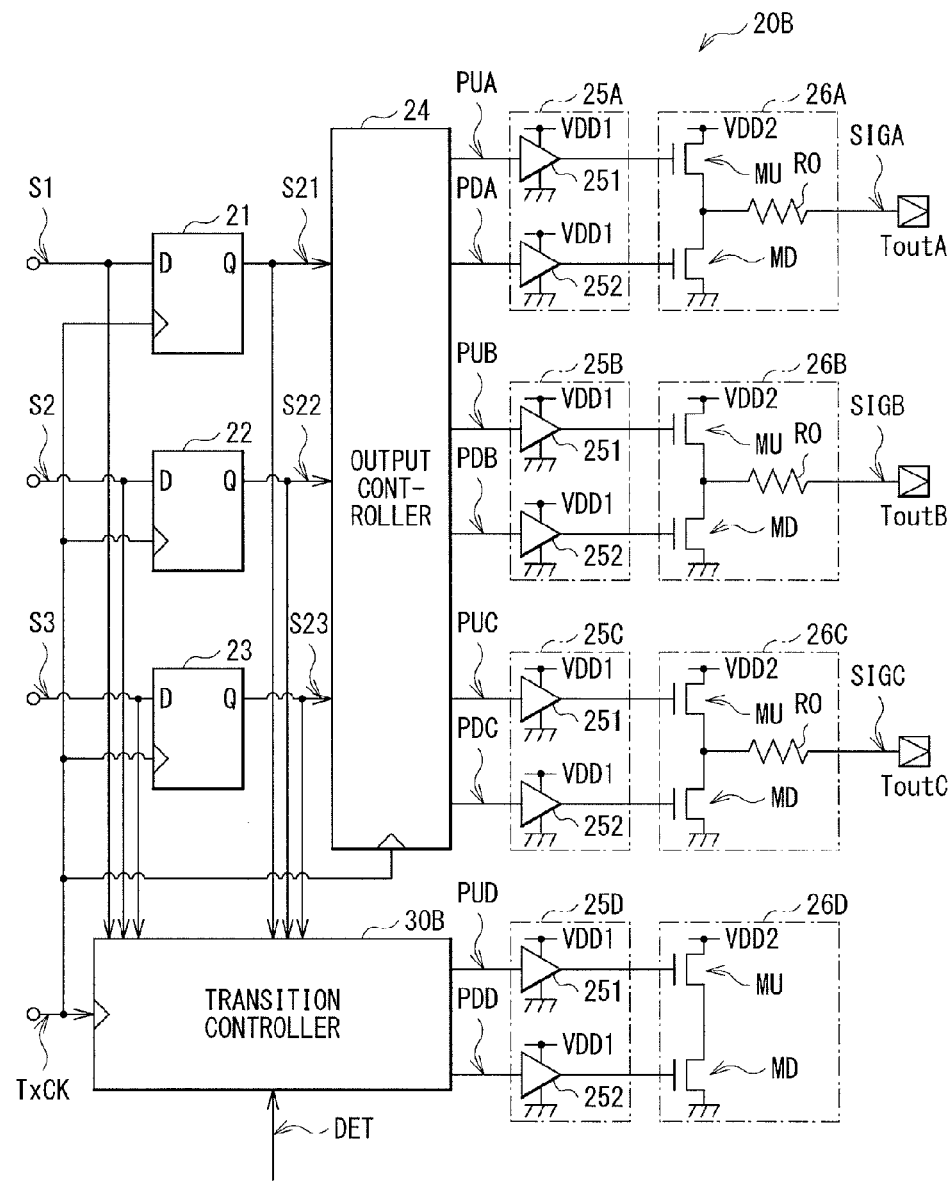

[ FIG. 21 ]
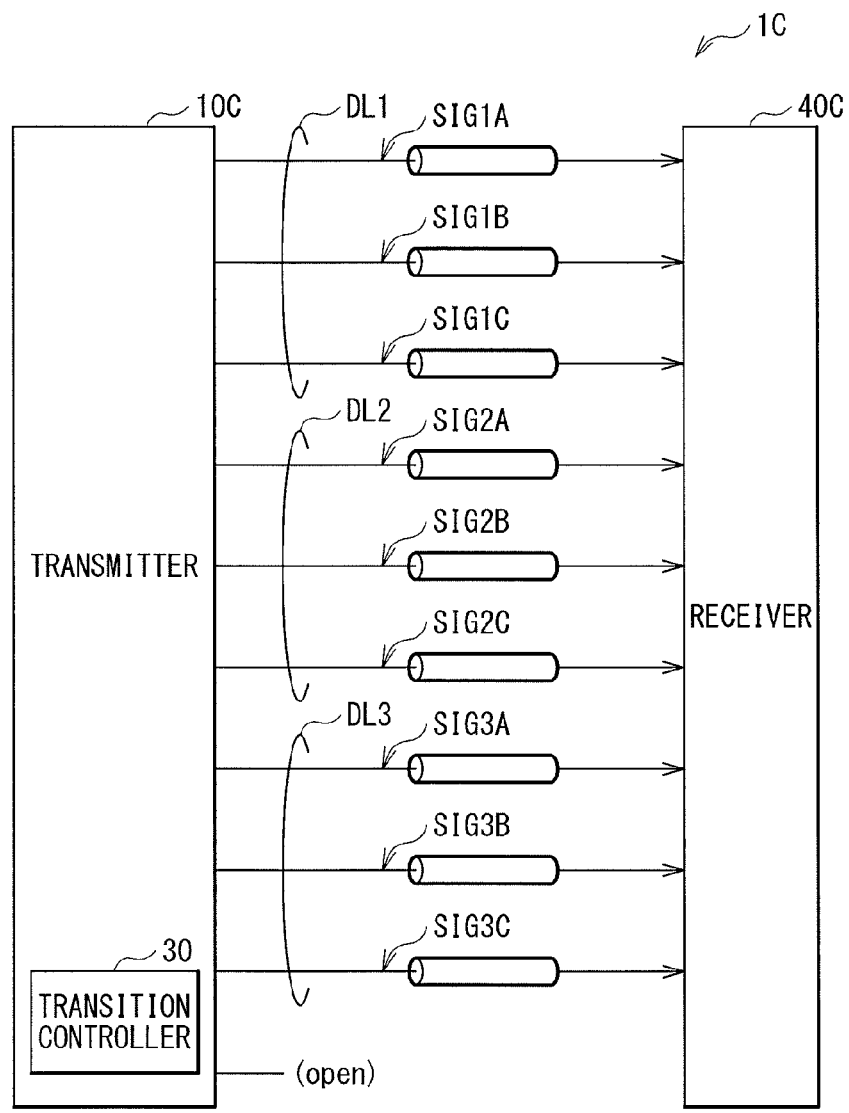

[ FIG. 22 ]
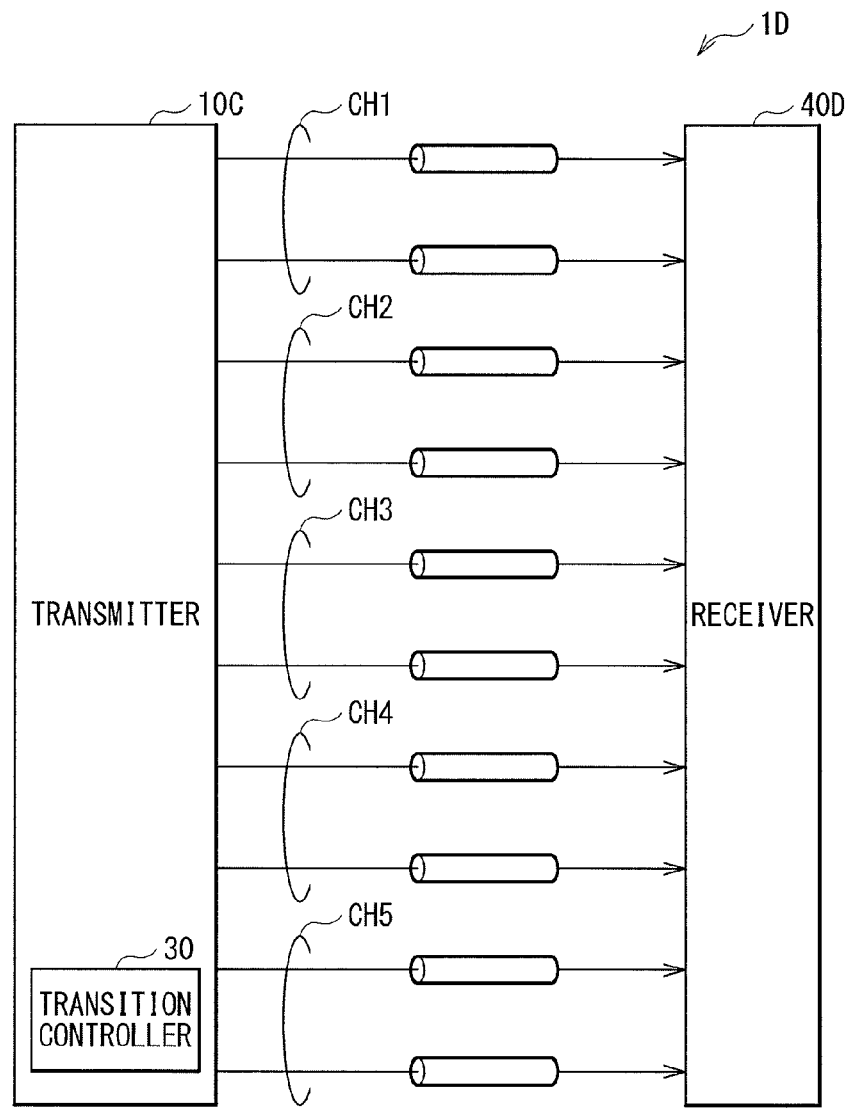

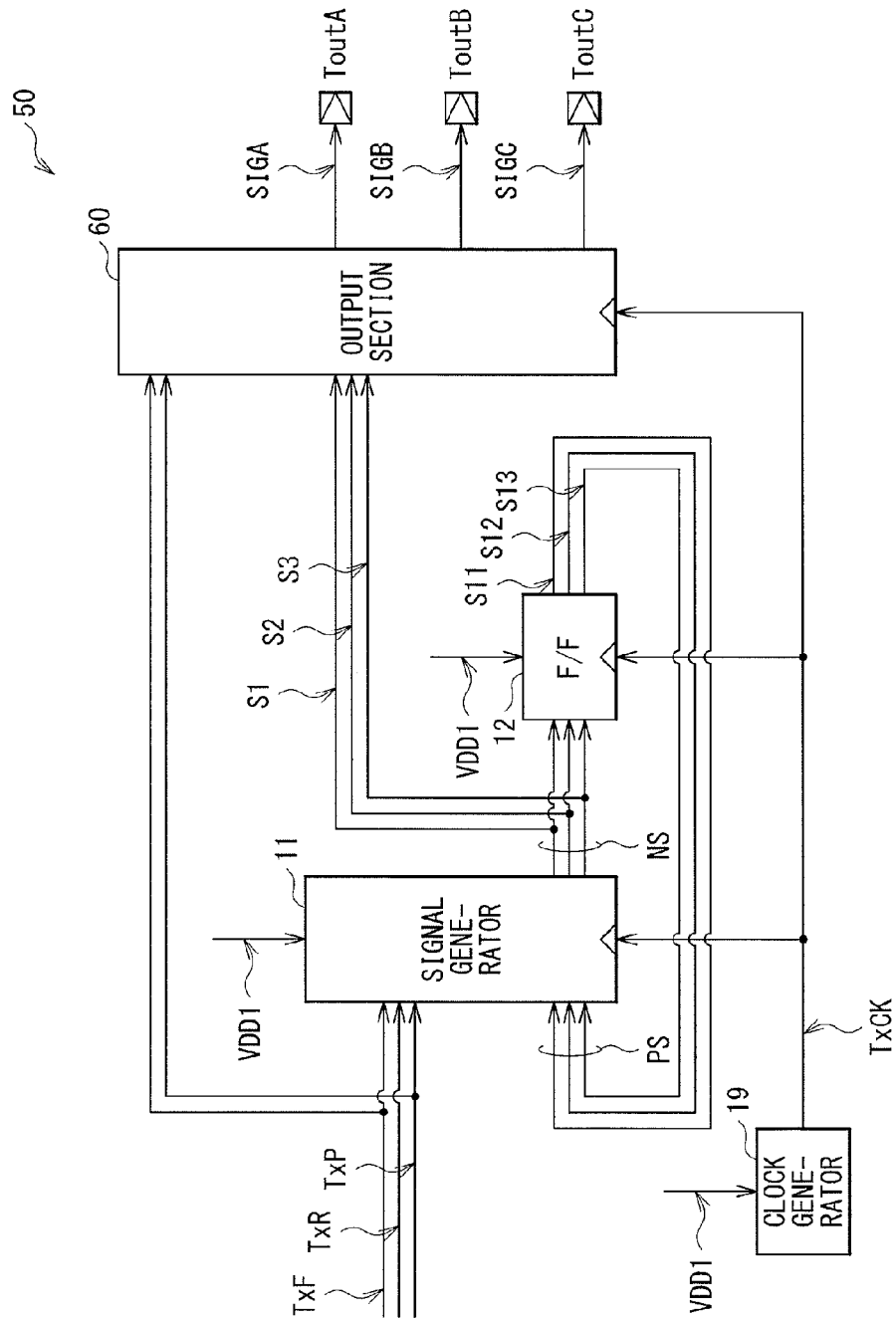
[ FIG. 23 ]

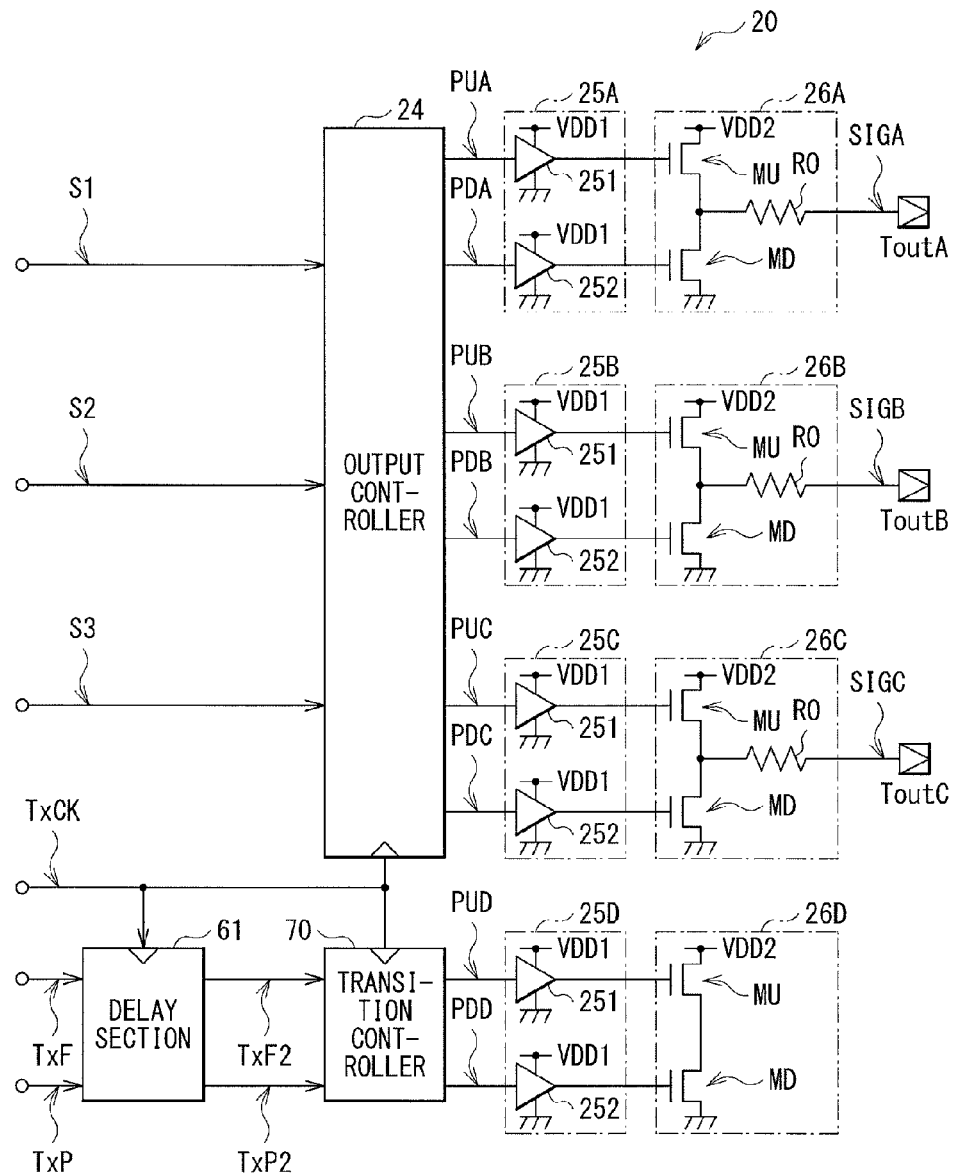
[ FIG. 24 ]

[ FIG. 25 ]
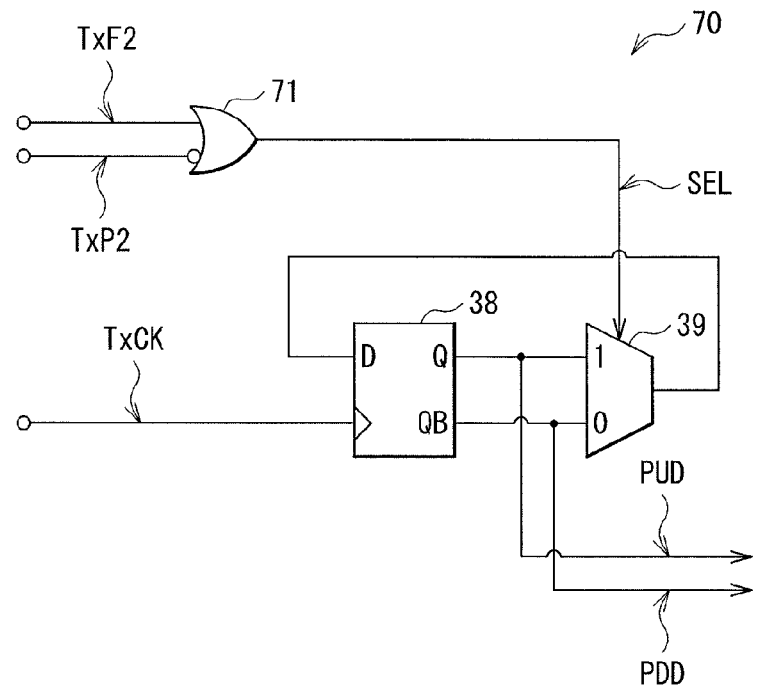
[ FIG. 26 ]
| SIGNAL TxF | SIGNAL TxP | SIGNAL SEL | SIGNAL PUD | SIGNAL PDD |
|---|---|---|---|---|
| 0 | 0 | 1 | | |
| 0 | 1 | 0 | ○ | ○ |
| 1 | 0 | 1 | | |
| 1 | 1 | 1 | | |

[ FIG. 27 ]
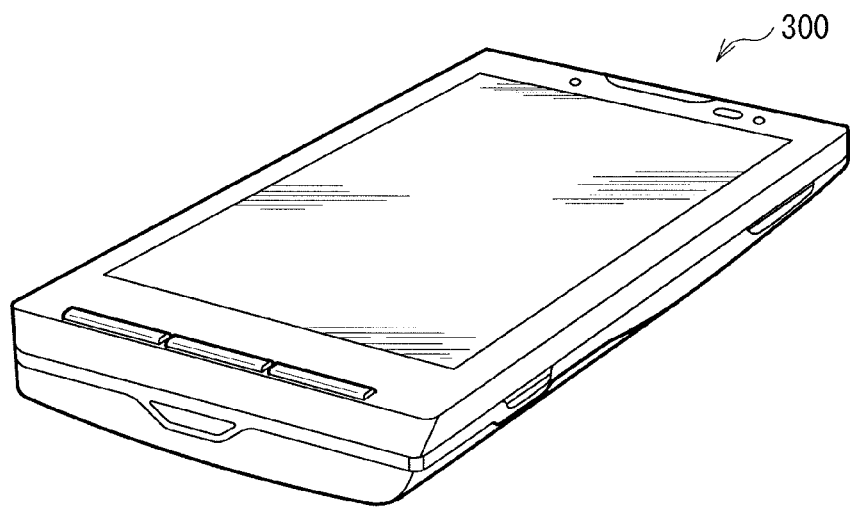

[ FIG. 28 ]
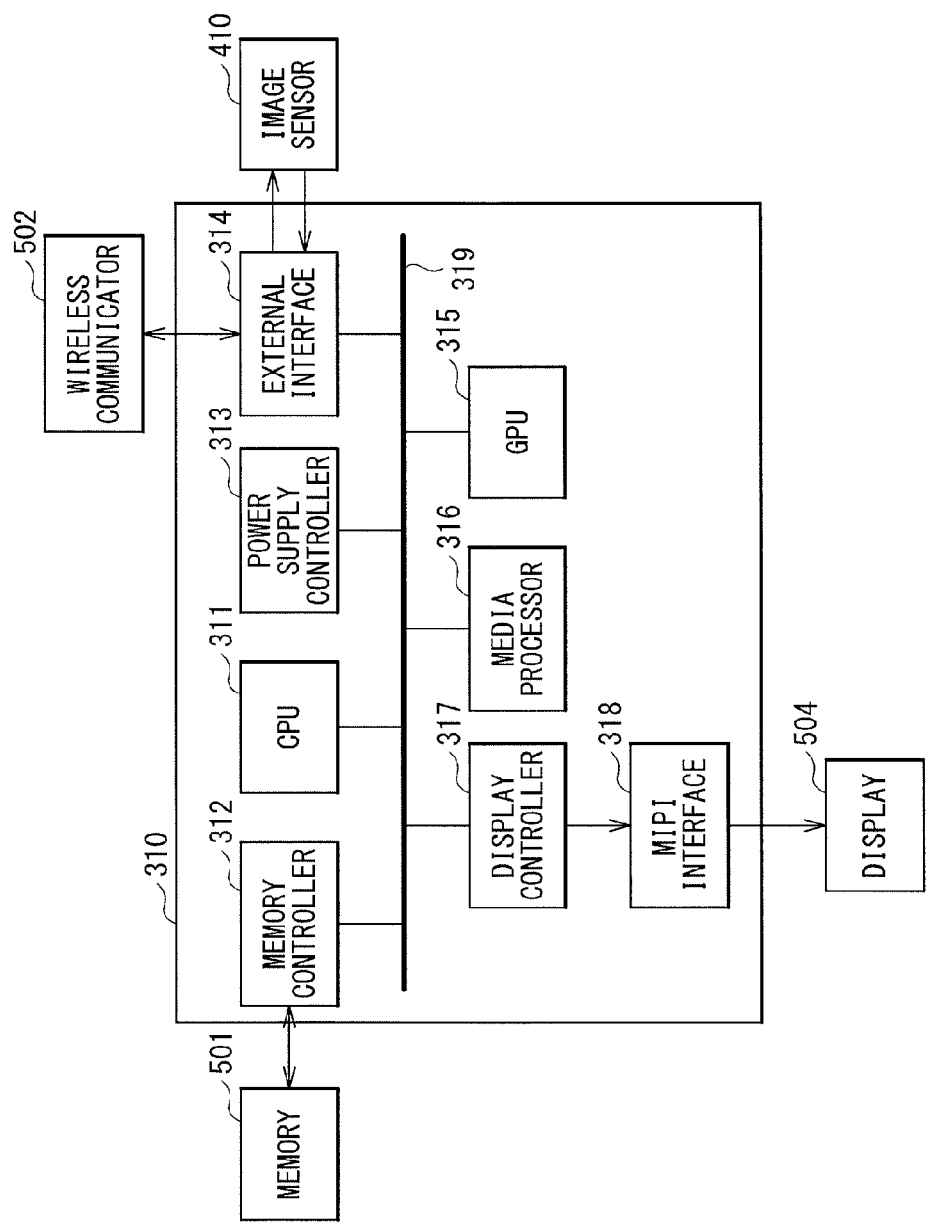

[ FIG. 29 ]
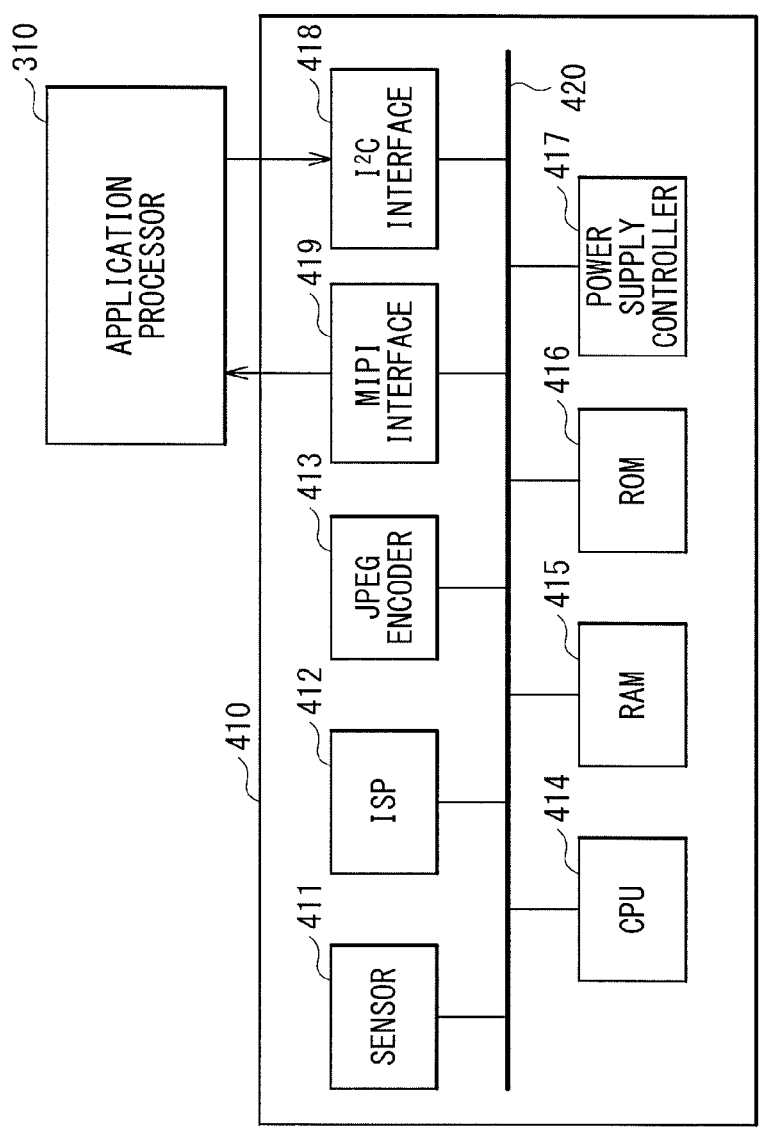

TRANSMITTER AND COMMUNICATION SYSTEM

TECHNICAL FIELD

The disclosure relates to a transmitter that transmits signals, and to a communication system that includes such a transmitter.

BACKGROUND ART

In association with highly-functional and multifunctional capabilities achieved in an electronic apparatus in recent years, a variety of devices such as semiconductor chips, sensors, and display devices have been built into the electronic apparatus. Large amounts of data have been exchanged to and from these devices, and the data amount has increased with the advancing highly-functional and multifunctional capabilities of the electronic apparatus. Therefore, the data exchange has been often carried out with use of a high-speed interface that makes it possible to transmit/receive data at the rate of several gigabits per second, for example.

In such a high-speed interface, many different technologies have been developed to improve the communication performance. For example, PTL 1 discloses a noise-cancelling circuit that suppresses a power-supply noise arising in a differential output buffer.

CITATION LIST

Patent Literature

PTL 1 Japanese Unexamined Patent Application Publication No. 2005-318264

SUMMARY OF THE INVENTION

As seen from the above, in a communication system, the advanced communication performance has been desired, and the further improved communication performance has been expected.

Accordingly, it is desirable to provide a transmitter and a communication system that allow for improvement of the communication performance.

A first transmitter according to an embodiment of the disclosure includes three first driver sections, three first pre-driver sections, a second pre-driver section, and a controller. The three first pre-driver sections are provided corresponding to the respective three first driver sections, and each drive corresponding one of the first driver sections on a basis of corresponding one of three first control signals, in which the three first control signals are different from one another and each include predetermined number of signals. The second pre-driver section operates on a basis of a second control signal, in which the second control signal includes predetermined number of signals. The controller controls transition of the predetermined number of signals included in the second control signal to allow number of signals to be subjected to the transition out of the plurality of signals included in the three first control signals and the plurality of signals included in the second control signal to be same between timings of the transition.

A second transmitter according to an embodiment of the disclosure includes a plurality of first driver sections, a plurality of first pre-driver sections, a second pre-driver section, and a controller. The plurality of first pre-driver sections are provided corresponding to the respective first driver sections, and each drive corresponding one of the first driver sections on a basis of corresponding one of first control signals, in which the first control signals are different from one another and each including predetermined number of signals. The second pre-driver section operates on a basis of a second control signal, in which the second control signal includes predetermined number of signals. The controller controls transition of the predetermined number of signals included in the second control signal to allow number of signals to be subjected to the transition out of the plurality of signals included in the first control signals and the plurality of signals included in the second control signal to be same between timings of the transition.

A communication system according to an embodiment of the disclosure is provided with a transmitter and a receiver. The transmitter includes three first driver sections, three first pre-driver sections, a second pre-driver section, and a controller. The three first pre-driver sections are provided corresponding to the respective three first driver sections, and each drive corresponding one of the first driver sections on a basis of corresponding one of three first control signals, in which the three first control signals are different from one another and each including predetermined number of signals. The second pre-driver section operates on a basis of a second control signal, in which the second control signal includes predetermined number of signals. The controller controls transition of the predetermined number of signals included in the second control signal to allow number of signals to be subjected to the transition out of the plurality of signals included in the three first control signals and the plurality of signals included in the second control signal to be same between timings of the transition.

In the first transmitter and the communication system according to the respective embodiments of the disclosure, the three first control signals and the second control signal are generated, and the three first pre-driver sections are controlled on the basis of the respective three first control signals, while the second pre-driver section is controlled on the basis of the second control signal. At this time, the transition of the predetermined number of signals included in the second control signal is controlled to allow the number of signals to be subjected to the transition out of the plurality of signals included in the three first control signals and the plurality of signals included in the second control signal to be the same between the timings of the transition.

In the second transmitter according to the embodiment of the disclosure, the plurality of first control signals and the second control signal are generated, and the first pre-driver sections are controlled on the basis of the respective first control signals, while the second pre-driver section is controlled on the basis of the second control signal. At this time, the transition of the predetermined number of signals included in the second control signal is controlled to allow the number of signals to be subjected to the transition out of the plurality of signals included in the first control signals and the plurality of signals included in the second control signal to be the same between the timings of the transition.

According to the first transmitter and the communication system in the respective embodiments of the disclosure, the transition of the predetermined number of signals included in the second control signal is controlled to allow the number of signals to be subjected to the transition out of the plurality of signals included in the three first control signals and the plurality of signals included in the second control signal to be the same between the timings of the transition, which allows the communication performance to be improved.

According to the second transmitter in the embodiment of the disclosure, the transition of the predetermined number of signals included in the second control signal is controlled to allow the number of signals to be subjected to the transition out of the plurality of signals included in the plurality of first control signals and the plurality of signals included in the second control signal is the same between the timings of the transition. Hence, it is possible to allow for improvement of the communication performance.

It is to be noted that effects described here are not necessarily limited to the effects described above, and may include any of effects that will be described in the disclosure.

BRIEF DESCRIPTION OF DRAWINGS

FIG. 1 is a block diagram illustrating a configuration example of a communication system according to an embodiment of the disclosure.

FIG. 2 is an explanatory diagram illustrating voltage status of signals that the communication system illustrated in FIG. 1 transmits/receives.

FIG. 3 is a block diagram illustrating a configuration example of a transmitter according to a first embodiment.

FIG. 4 is an explanatory diagram illustrating transition of symbols that the communication system illustrated in FIG. 1 transmits/receives.

FIG. 5 is a table representing an operation example of a signal generator 11 illustrated in FIG. 3.

FIG. 6 is a block diagram illustrating a configuration example of an output section illustrated in FIG. 3.

FIG. 7 is a table representing an operation example of the output section illustrated in FIG. 3.

FIG. 8 is a circuit diagram illustrating a configuration example of a transition controller illustrated in FIG. 6.

FIG. 9 is a table representing an operation example of the transition controller illustrated in FIG. 8.

FIG. 10 is a block diagram illustrating a configuration example of a receiver illustrated in FIG. 1.

FIG. 11 is an explanatory diagram illustrating an example of receiving operation of the receiver illustrated in FIG. 10.

FIG. 12 is a timing waveform chart illustrating an operation example of the transmitter illustrated in FIG. 3.

FIG. 13 is a table representing an operation example of the transmitter illustrated in FIG. 3.

FIG. 14 is a timing waveform chart illustrating an operation example of a transmitter according to a comparative example.

FIG. 15 is a table representing an operation example of the transmitter according to the comparative example.

FIG. 16 is a block diagram illustrating a configuration example of an output section according to a modification example of the first embodiment.

FIG. 17 is a block diagram illustrating a configuration example of a communication system according to another modification example of the first embodiment.

FIG. 18 is a block diagram illustrating a configuration example of a receiver illustrated in FIG. 17.

FIG. 19 is a block diagram illustrating a configuration example of a transmitter illustrated in FIG. 17.

FIG. 20 is a block diagram illustrating a configuration example of an output section illustrated in FIG. 19.

FIG. 21 is a block diagram illustrating a configuration example of a communication system to which a transmitter according to another modification example of the first embodiment is applied.

FIG. 22 is a block diagram illustrating a configuration example of another communication system to which the transmitter illustrated in FIG. 21 is applied.

FIG. 23 is a block diagram illustrating a configuration example of a transmitter according to a second embodiment.

FIG. 24 is a block diagram illustrating a configuration example of an output section illustrated in FIG. 23.

FIG. 25 is a circuit diagram illustrating a configuration example of a transition controller illustrated in FIG. 24.

FIG. 26 is a table representing an operation example of the transition controller illustrated in FIG. 25.

FIG. 27 is a perspective view of an external appearance configuration of a smartphone to which the communication system according to any of the above-described embodiments is applied.

FIG. 28 is a block diagram illustrating a configuration example of an application processor to which the communication system according to any of the above-described embodiments is applied.

FIG. 29 is a block diagram illustrating a configuration example of an image sensor to which the communication system according to any of the above-described embodiments is applied.

DESCRIPTION OF EMBODIMENTS

Hereinafter, some embodiments of the disclosure are described in detail with reference to the drawings. It is to be noted that description is given in the following order.
1. First Embodiment
2. Second Embodiment
3. Application Examples 1. First Embodiment Configuration Examples FIG. 1 illustrates a configuration example of a communication system (communication system 1) to which a transmitter according to a first embodiment of the disclosure is applied. The communication system 1 may perform communication using signals each having three voltage levels.

The communication system 1 includes a transmitter 10 and a receiver 40. In the communication system 1, the transmitter 10 may transmit signals SIGA, SIGB, and SIGC to the receiver 40 through transmission lines 9A, 9B, and 9C, respectively. A characteristic impedance of each of the transmission lines 9A to 9C through which these signals are transmitted may be about 50Ω in this example. Each of the signals SIGA, SIGB, and SIGC may make transition among three voltage levels (a high-level voltage VH, a medium-level voltage VM, and a low-level voltage VL).

FIG. 2 illustrates voltage status of the signals SIGA, SIGB, and SIGC. The transmitter 10 may use the three signals SIGA, SIGB, and SIGC to transmit six symbols "+x", "−x", "+y", "−y", "+z", and "−z". For example, in transmitting the symbol "+x", the transmitter 10 may set the signal SIGA at the high-level voltage VH; may set the signal SIGB at the low-level voltage VL; and may set the signal SIGC at the medium-level voltage VM. In transmitting the symbol "−x", the transmitter 10 may set the signal SIGA at the low-level voltage VL; may set the signal SIGB at the high-level voltage VH; and may set the signal SIGC at the medium-level voltage VM. In transmitting the symbol "+y", the transmitter 10 may set the signal SIGA at the medium-level voltage VM; may set the signal SIGB at the high-level voltage VH; and may set the signal SIGC at the low-level voltage VL. In transmitting the symbol "−y", the transmitter 10 may set the signal SIGA at the medium-level voltage VM; may set the signal SIGB at the low-level voltage VL; and may set the signal SIGC at the high-level voltage VH. In transmitting the symbol "+z", the transmitter 10 may set the signal SIGA at the low-level voltage VL; may set the signal SIGB at the medium-level voltage VM; and may set the signal SIGC at the high-level voltage VH. In transmitting the symbol "−z", the transmitter 10 may set the signal SIGA at the high-level voltage VH; may set the signal SIGB at the medium-level voltage VM; and may set the signal SIGC at the low-level voltage VL.

FIG. 3 illustrates a configuration example of the transmitter 10. The transmitter 10 may have a clock generator 19, a signal generator 11, a flip-flop (F/F) 12, and an output section 20. A supply voltage VDD1 may be provided to each of these blocks with the exception of driver sections 26A to 26D to be hereinafter described, and each of such blocks may operate on the basis of the supply voltage VDD1.

The clock generator 19 may generate a clock TxCK. The clock generator 19 may be configured with use of, for example, a PLL (Phase-Locked Loop), and may generate the clock TxCK on the basis of a reference clock (not illustrated) that is supplied from the outside of the transmitter 10, for example. Thereafter, the clock generator 19 may provide the clock TxCK to the signal generator 11, the flip-flop 12, and the output section 20.

The signal generator 11 may determine a symbol NS on the basis of a symbol PS indicated by signals S11 to S13, as well as signals TxF, TxR, and TxP, and the clock TxCK to output the determined symbol NS using signals S1 to S3. Here, each of the symbols NS and PS indicates any one of the six symbols "+x", "−x", "+y", "−y", "+z", and "−z". The symbol PS is a symbol that has been transmitted previously (a previous symbol), and the symbol NS is a symbol that is to be transmitted next (a next symbol).

FIG. 4 illustrates operation of the signal generator 11. FIG. 4 illustrates the transition among the six symbols "+x", "−x", "+y", "−y", "+z", and "−z". A three-digit value assigned to each transition denotes each value of the signals TxF, TxR, and TxP in this order.

The signal TxF (Flip) may make the symbols transition between "+x" and "−x", between "+y" and "−y", and between "+z" and "−z". Specifically, when the transition signal TxF is "1", the transition (for example, transition from "+x" to "−x") may take place to change polarity of the symbols. When the transition signal TxF is "0", such transition may not take place.

When the signal TxF is "0", the signals TxR (Rotation) and TxP (Polarity) may make the symbols transition other than between "+x" and "−x", other than between "+y" and "−y", and other than between "+z" and "−z". Specifically, when the signals TxR and TxP are "1" and "0", respectively, the transition may take place clockwise (for example, transition from "+x" to "+y") in FIG. 4 in a state of retaining the symbol polarities. When the signals TxR and TxP are "1" and "1", respectively, the transition may take place clockwise (for example, transition from "+x" to "−y") in FIG. 4 in a state of changing the symbol polarities. Further, when the signals TxR and TxP are "0" and "0", respectively, the transition may take place counterclockwise (for example, transition from "+x" to "+z") in FIG. 4 in a state of retaining the symbol polarities. When the signals TxR and TxP are "0" and "1", respectively, the transition may take place counterclockwise (for example, transition from "+x" to "−z") in FIG. 4 in a state of changing the symbol polarities.

In such a manner, in the signal generator 11, a direction of the symbol transition may be determined by the signals TxF, TxR, and TxP. The signal generator 11 may determine the symbol NS on the basis of the symbol PS indicated by the signals S11 to S13, as well as the signals TxF, TxR, and TxP, and the clock TxCK to output the determined symbol NS using the signals S1 to S3. In this example, as illustrated in FIG. 5, the symbol NS may be associated with the signals S1 to S3, and the symbol PS may be associated with the signals S11 to S13. Thereafter, the signal generator 11 may provide the symbol NS to the flip-flop 12 and the output section 20 using the signals S1 to S3.

The flip-flop 12 may delay the signals S1, S2, and S3 by a single clock cycle of the clock TxCK to output these delayed signals as the signals S11, S12, and S13, respectively. In other words, the flip-flop 12 may generate the symbol PS in a manner of delaying the symbol NS indicated by the signals S1, S2, and S3 by a single clock cycle of the clock TxCK. Thereafter, the flip-flop 12 may provide the signals S11, S12, and S13 to the signal generator 11.

The output section 20 may generate the signals SIGA, SIGB, and SIGC on the basis of the signals S1 to S3 to output these resulting signals from output terminals ToutA, ToutB, and ToutC, respectively.

FIG. 6 illustrates a configuration example of the output section 20. The output section 20 may include flip-flops 21 to 23, an output controller 24, pre-driver sections 25A, 25B, 25C, and 25D, driver sections 26A, 26B, 26C, and 26D, as well as a transition controller 30.

The flip-flop 21 may sample the signal S1 on the basis of the clock TxCK to output a sampling result as a signal S21. The flip-flop 22 may sample the signal S2 on the basis of the clock TxCK to output a sampling result as a signal S22. The flip-flop 23 may sample the signal S3 on the basis of the clock TxCK to output a sampling result as a signal S23.

The output controller 24 may generate six signals PUA, PDA, PUB, PDB, PUC, and PDC on the basis of the signals S21, S22, and S23, as well as the clock TxCK. Thereafter, the output controller 24 may provide the signals PUA and PDA to the pre-driver 25A; may provide the signals PUB and PDB to the pre-driver 25B; and may provide the signals PUC and PDC to the pre-driver 25C.

The pre-driver section 25A may drive the driver section 26A on the basis of the signals PUA and PDA; the pre-driver section 25B may drive the driver section 26B on the basis of the signals PUB and PDB; and the pre-driver section 25C may drive the driver section 26C on the basis of the signals PUC and PDC.

The pre-driver section 25A may have pre-drivers 251 and 252. The pre-driver 251 may drive a transistor MU (to be described later) of the driver section 26A on the basis of the signal PUA, and the pre-driver 252 may drive a transistor MD (to be described later) of the driver section 26A on the basis of the signal PDA. Each of output signals from the pre-drivers 251 and 252 may transition between the supply voltage VDD1 and a ground voltage. The same is true for the pre-driver sections 25B and 25C.

The driver section 26A may generate the signal SIGA; the driver section 26B may generate the signal SIGB; and the driver section 26C may generate the signal SIGC.

The driver section 26A may have the transistors MU and MD, as well as a resistor RO. Each of the transistors MU and MD may be an N-channel MOS (Metal-Oxide Semiconductor) FET (Field-Effect Transistor). A supply voltage VDD2 may be provided to a drain of the transistor MU; an output signal of the pre-driver 251 of the pre-driver section 25A may be provided to a gate thereof; and a source thereof may be coupled to a drain of the transistor MD and a first end of the resistor RO. The drain of the transistor MD may be coupled to the source of the transistor MU and the first end of the resistor RO; an output signal of the pre-driver 252 of the pre-driver section 25A may be provided to a gate thereof; and a source thereof may be grounded. The resistor RO may function as a termination resistor, and a resistance thereof may be 50Ω in this example. The first end of the resistor RO may be coupled to the source of the transistor MU and the drain of the transistor MD, and a second end thereof may be coupled to the output terminal ToutA. The same is true for the driver sections 26B and 26C.

With such a configuration, on the basis of the signals S1 to S3, the output section 20 may set voltages of the output terminals ToutA to ToutC at three voltages that are different from one another (the high-level voltage VH, the medium-level voltage VM, and the low-level voltage VL), as illustrated in FIG. 2.

FIG. 7 illustrates an operation example of the output section 20. For example, when the transmitter 10 transmits the symbol "+x", the signals S21, S22, and S23 may become "100" respectively, as with the signals S1, S2, and S3 (FIG. 5). The output controller 24 may set the signals PUA, PDA, PUB, PDB, PUC, and PDC at "100100" respectively on the basis of the signals S21, S22, and S23. As a result, in the driver section 26A, the transistor MU may turn on, and the transistor MD may turn off, leading to the voltage (signal SIGA) of the output terminal ToutA being set at the high-level voltage VH. Further, in the driver section 26B, the transistor MU may turn off, and the transistor MD may turn on, resulting in the voltage (signal SIGB) of the output terminal ToutB being set at the low-level voltage VL. In addition, in the driver section 26C, both of the transistors MU and MD may turn off, resulting in the voltage (signal SIGC) of the output terminal ToutC being set at the medium-level voltage VM through resistors 41B and 41C of the receiver 40 to be hereinafter described.

The transition controller 30 (FIG. 6) may generate two signals PUD and PDD on the basis of the signals S1, S2, and S3, the signals S21, S22, and S23, as well as the clock TxCK. Specifically, as described later, the transition controller 30 may make the signals PUD and PDD transition on the basis of the transition of each of the signals S21 to S23.

FIG. 8 illustrates a configuration example of the transition controller 30. The transition controller 30 may include exclusive-OR circuits 31 to 33, AND circuits 34A to 36, an OR circuit 37, a flip-flop 38, and a selector 39.

The exclusive-OR circuit 31 may determine an exclusive OR of the signal S1 and the signal S21. A circuit including the exclusive-OR circuit 31 and the flip-flop 21 may function as a circuit that detects transition in the signal S21. The exclusive-OR circuit 32 may determine an exclusive OR of the signal S2 and the signal S22. A circuit including the exclusive-OR circuit 32 and the flip-flop 22 may function as a circuit that detects transition in the signal S22. The exclusive-OR circuit 33 may determine an exclusive OR of the signal S3 and the signal S23. A circuit including the exclusive-OR circuit 33 and the flip-flop 23 may function as a circuit that detects transition in the signal S23.

The AND circuit 34 may determine a logical AND of an output signal of the exclusive-OR circuit 31 and an output signal of the exclusive-OR circuit 32. The AND circuit 35 may determine a logical AND of the output signal of the exclusive-OR circuit 32 and an output signal of the exclusive-OR circuit 33. The AND circuit 36 may determine a logical AND of the output signal of the exclusive-OR circuit 33 and the output signal of the exclusive-OR circuit 31. The OR circuit 37 may determine a logical sum of the output signals of the AND circuits 34 to 36 to output a result as a signal SEL. In other words, when two or more of the three output signals from the exclusive-OR circuits 31 to 33 indicate "1", the AND circuits 34 to 36 and the OR circuit 37 may set the signal SEL at "1", and may set the signal SEL at "0" otherwise.

The flip-flop 38 may sample an output signal of the selector 39 on the basis of the clock TxCK to output a sampling result as the signal PUD and an inverted logic of the sampling result as the signal PDD. The selector 39 may select and output one of the two signals PUD and PDD depending on the signal SEL. Specifically, the selector 39 may select and output the signal PUD if the signal SEL indicates "1", and may select and output the signal PDD if the signal SEL indicates "0". A circuit including the flip-flop 38 and the selector 39 may retain respective logic levels of the signals PUD and PDD if the signal SEL is "1", and may invert the respective logic levels of the signals PUD and PDD if the signal SEL is "0".

The pre-driver section 25D may drive the driver section 26D on the basis of the signals PUD and PDD. The pre-driver section 25D may have a configuration similar to the configuration of each of the pre-driver sections 25A to 25C.

The driver section 26D may be a so-called dummy driver that functions as a load of the pre-driver section 25D. The driver section 26D may have the transistors MU and MD in this example. In other words, the driver section 26D may have a configuration in which the resistor RO is omitted from each of the driver sections 26A to 26C, and may not output any signals.

FIG. 9 represents an operation example of the transition controller 30. In FIG. 9, a "round mark" indicates that the relevant signal may transition, and a blank column indicates that the relevant signal may not transition. For example, if two or more of the signals S21 to S23 are made to transition, the signal SEL may become "1", and the signals PUD and PDD may not be made to transition. Further, otherwise, the signal SEL may become "0", and the signals PUD and PDD may be made to transition.

In such a manner, the transition controller 30 may make the signals PUD and PDD transition depending on the transition of the signals S21 to S23. With such operation, in the output section 20, as described later, the number of the transition signals among the eight signals PUA, PDA, PUB, PDB, PUC, PDC, PUD, and PDD to be inputted to the four pre-driver sections 25A to 25D is matched between transition timings.

FIG. 10 illustrates a configuration example of the receiver 40. The receiver 40 may include resistors 41A, 41B, and 41C, amplifiers 42A, 42B, and 42C, a clock generator 43, flip-flops 44 and 45, and a signal generator 46.

The resistors 41A, 41B, and 41C may function as termination resistors in the communication system 1. A first end of the resistor 41A may be coupled to the input terminal TinA, and be supplied with the signal SIGA, while a second end thereof may be coupled to second ends of the resistors 41B and 41C. A first end of the resistor 41B may be coupled to the input terminal TinB, and be supplied with the signal SIGB, while the second end thereof may be coupled to the second ends of the resistors 41A and 41C. A first end of the resistor 41C may be coupled to the input terminal TinC, and be supplied with the signal SIGC, while the second end thereof may be coupled to the second ends of the resistors 41A and 41B.

Each of the amplifiers 42A, 42B, and 42C may output a signal corresponding to a difference between a signal on a positive input terminal and a signal on a negative input terminal. A positive input terminal of the amplifier 42A may be coupled to a negative input terminal of the amplifier 42C and the first end of the resistor 41A, while be supplied with the signal SIGA, and a negative input terminal thereof may be coupled to a positive input terminal of the amplifier 42B and the first end of the resistor 41B, while be supplied with the signal SIGB. A positive input terminal of the amplifier 42B may be coupled to the negative input terminal of the amplifier 42A and the first end of the resistor 41B, while be supplied with the signal SIGB, and a negative input terminal thereof may be coupled to a positive input terminal of the amplifier 42C and the first end of the resistor 41C, while be supplied with the signal SIGC. A positive input terminal of the amplifier 42C may be coupled to the negative input terminal of the amplifier 42B and the first end of the resistor 41C, while be supplied with the signal SIGC, and a negative input terminal thereof may be coupled to the positive input terminal of the amplifier 42A and the first end of the resistor 41A, while be supplied with the signal SIGA.

With such a configuration, the amplifier 42A may output a signal corresponding to a difference (SIGA−SIGB) between the signal SIGA and the signal SIGB; the amplifier 42B may output a signal corresponding to a difference (SIGB−SIGC) between the signal SIGB and the signal SIGC; and the amplifier 42C may output a signal corresponding to a difference (SIGC−SIGA) between the signal SIGC and the signal SIGA.

FIG. 11 illustrates an operation example of the amplifiers 42A, 42B, and 42C. In this example, the signal SIGA may be the high-level voltage VH, and the signal SIGB may be the low-level voltage VL. At this time, a voltage of the signal SIGC may be set at the medium-level voltage VM through the resistors 41A, 41B, and 41C. In this case, a current Iin may flow through the input terminal TinA, the resistor 41A, the resistor 41B, and the input terminal TinB in this order. Thereafter, since the high-level voltage VH is provided to the positive input terminal of the amplifier 42A, while the low-level voltage VL is provided to the negative input terminal thereof, and the difference becomes positive, the amplifier 42A may output "1". Further, since the low-level voltage VL is provided to the positive input terminal of the amplifier 42B, while the medium-level voltage VM is provided to the negative input terminal thereof, and the difference becomes negative, the amplifier 42B may output "0". In addition, since the medium-level voltage VM is provided to the positive input terminal of the amplifier 42C, while the high-level voltage VH is provided to the negative input terminal thereof, and the difference becomes negative, the amplifier 42C may output "0".

The clock generator 43 may generate a clock RxCK on the basis of output signals of the amplifiers 42A, 42B, and 42C.

The flip-flop 44 may delay the output signals of the amplifiers 42A, 42B, and 42C by a single clock cycle of the clock RxCK to provide each of such delayed output signals. In other words, an output signal of the flip-flop 34 may indicate a symbol NS2. Here, the symbol NS2 indicates any one of the six symbols "+x", "−x", "+y", "−y", "+z", and "−z", as with the symbols PS and NS.

The flip-flop 45 may delay three output signals of the flip-flop 44 by a single clock cycle of the clock RxCK to provide each of such delayed output signals. In other words, the flip-flop 45 may generate a symbol PS2 in a manner of delaying the symbol NS2 by a single clock cycle of the clock RxCK. The symbol PS2 is a previously received symbol, and indicates any one of the six symbols "+x", "−x", "+y", "−y", "+z", and "−z", as with the symbol NS2.

The signal generator 46 may generate signals RxF, RxR, and RxP on the basis of the output signals of the flip-flops 44 and 45, as well as the clock RxCK. The signals RxF, RxR, and RxP may correspond to the signals TxF, TxR, and TxP in the transmitter 10 respectively, and may indicate transition of the symbols. The signal generator 46 may identify the transition of the symbols (FIG. 4) on the basis of the symbol CS2 indicated by the output signal of the flip-flop 44 and the previous symbol PS2 indicated by the output signal of the flip-flop 45 to generate the signals RxF, RxR, and RxP.

Here, the output controller 24 corresponds to a specific example of a "first controller" in the disclosure. The transition controller 30 corresponds to a specific example of a "second controller" in the disclosure. Each of the pre-driver sections 25A to 25C corresponds to a specific example of a "first pre-driver" in the disclosure. The pre-driver section 25D corresponds to a specific example of a "second pre-driver" in the disclosure. Each of the driver sections 26A to 26C corresponds to a specific example of a "first driver" in the disclosure. The driver section 26D corresponds to a specific example of a "third driver" in the disclosure.

[Operation and Workings]

Next, the description is provided on operation and workings of the communication system 1 according to the present embodiment.

[Overview of Overall Operation]

First, an overview of overall operation of the communication system 1 is described with reference to FIG. 1 and other figures. In the transmitter 10, the clock generator 19 may generate the clock TxCK. The signal generator 11 may determine the next symbols NS on the basis of the previous symbols PS and the signals TxF, TxR, and TxP, and may output the determined symbols NS using the signals S1 to S3. The flip-flop 12 may generate the signals S11 to S13 (symbols PS) in a manner of delaying the signals S1 to S3 (symbols NS) by a single clock cycle of the clock TxCK.

In the transmitter section 20 (FIG. 6), the flip-flop 21 may sample the signal S1 on the basis of the clock TxCK to output a sampling result as the signal S21; the flip-flop 22 may sample the signal S2 on the basis of the clock TxCK to output a sampling result as the signal S22; and the flip-flop 23 may sample the signal S3 on the basis of the clock TxCK to output a sampling result as the signal S23. The output controller 24 may generate the six signals PUA, PDA, PUB, PDB, PUC, and PDC on the basis of the signals S21 to S23 and the clock TxCK. The transition controller 30 may generate the two signals PUD and PDD on the basis of the signals S1 to S3, the signals S21 to S23, and the clock TxCK. The pre-driver section 25A may drive the driver section 26A on the basis of the signals PUA and PDA, and the driver section 26A may generate the signal SIGA. The pre-driver section 25B may drive the driver section 26B on the basis of the signals PUB and PDB, and the driver section 26B may generate the signal SIGB. The pre-driver section 25C may drive the driver section 26C on the basis of the signals PUC and PDC, and the driver section 26C may generate the signal SIGC. The pre-driver section 25D may drive the driver section 26D on the basis of the signals PUD and PDD.

In the receiver 40 (FIG. 10), the amplifier 42A may output the signal corresponding to the difference between the signal SIGA and the signal SIGB; the amplifier 42B may output the signal corresponding to the difference between the signal SIGB and the signal SIGC; and the amplifier 42C may output the signal corresponding to the difference between the signal SIGC and the signal SIGA. The clock generator 43 may generate the clock RxCK on the basis of the output signals of the amplifiers 42A, 42B, and 42C. The flip-flop 44 may delay the output signals of the amplifiers 42A, 42B, and 42C by a single clock cycle of the clock RxCK to provide each of such delayed output signals. The flip-flop 45 may delay the three output signals of the flip-flop 44 by a single clock cycle of the clock RxCK to provide each of such delayed output signals. The signal generator 46 may generate the signals RxF, RxR, and RxP on the basis of the output signals of the flip-flops 44 and 45, as well as the clock RxCK.

[Detailed Operation]

The output section 20 may set voltages of the output terminals ToutA to ToutC at three voltages that are different from one another (the high-level voltage VH, the medium-level voltage VM, and the low-level voltage VL) on the basis of the signals S1 to S3. Hereinafter, the description is provided on the detailed operation of the output section 20.

FIG. 12 illustrates an operation example of the output section 20. In FIG. 12, (A) to (C) denote waveforms of the signals SIGA to SIGC, respectively; (D) to (K) denote waveforms of the signals PUA, PDA, PUB, PDB, PUC, PDC, PUD, and PDD, respectively; (L) denotes a waveform of a supply current Iac to be provided to the four pre-drivers 25A, 25B, 25C, and 25D; and (M) denotes a waveform of the supply voltage VDD1. In this example, the output section 20 may transmit the symbols in the order of "+x", "−y", "−z", and so on.

As represented in FIG. 7, the output controller 24 may set each of the signals PUA, PDA, PUB, PDB, PUC, and PDC at "1" or "0" depending on the symbol to be transmitted (FIGS. 12 (D) to (I)). The pre-driver 25A may drive the driver section 26A on the basis of the signals PUA and PDA, and the driver section 26A may generate the signal SIGA (FIG. 12 (A)). Similarly, the pre-driver 25B may drive the driver section 26B on the basis of the signals PUB and PDB, and the driver section 26B may generate the signal SIGB (FIG. 12 (B)). Further, the pre-driver 25C may drive the driver section 26C on the basis of the signals PUC and PDC, and the driver section 26C may generate the signal SIGC (FIG. 12 (C)).

At this time, the transition controller 30 may make the signals PUD and PDD transition depending on the transition of the signals S21 to S23, and may control the pre-driver 25D to allow the number of the transition signals among the eight signals PUA, PDA, PUB, PDB, PUC, PDC, PUD, and PDD to be inputted to the four pre-driver sections 25A to 25D to be matched between the transition timings.

FIG. 13 represents the number N1 of the transition signals among the three signals S21 to S23, and the number N2 of the transition signals among the eight signals PUA, PDA, PUB, PDB, PUC, PDC, PUD, and PDD in each transition of the symbols. In this example, the transition controller 30 may control the pre-driver 25D to allow the number N2 of the transition signals among the eight signals PUA, PDA, PUB, PDB, PUC, PDC, PUD, and PDD to be "4" in each transition of the symbols.

Hereinafter, the concrete description is provided with reference to FIGS. 12 and 13. First, attention is focused on the symbol transition from "+x" to "−y" at timing t1 in FIG. 12. In this manner, when the symbol transitions from "+x" to "−y", one (signal S23) of the three signals S21 to S23 may be made to transition, as illustrate in FIG. 13. Accordingly, the transition controller 30 may make the signals PUD and PDD transition. As a result, in the output section 20, the four signals PUA, PUC, PUD, and PDD among the eight signals PUA, PDA, PUB, PDB, PUC, PDC, PUD, and PDD may be made to transition (FIGS. 12 (D) to (K)) at the timing t1 in FIG. 12.

Next, attention is focused on the symbol transition from "−y" to "−z" at timing t2 in FIG. 12. In this manner, when the symbol transitions from "−y" to "−z", two (signals S22 and S23) of the three signals S21 to S23 may be made to transition, as illustrate in FIG. 13. Accordingly, the transition controller 30 may retain the signals PUD and PDD. As a result, the four signals PUA, PDB, PUC, and PDC among the eight signals PUA, PDA, PUB, PDB, PUC, PDC, PUD, and PDD may be made to transition (FIGS. 12 (D) to (K)).

Here, the description is provided on the symbol transition at the timing t1 and t2 in FIG. 12; however, the same is true for any other transition in the subsequent timings.

As described above, in the output section 20, the number N2 of the transition signals among the eight signals PUA, PDA, PUB, PDB, PUC, PDC, PUD, and PDD is matched between the transition timings. In the output section 20, this allows a magnitude of the supply current Iac to be provided to the four pre-drivers 25A, 25B, 25C, and 25D to be almost equivalent to one another in each transition timing, as illustrated in FIG. 12 (L). As a result, as described in contrast with a comparative example below, the transmitter 10 makes it possible to suppress fluctuation in the supply voltage VDD1 (FIG. 12 (K)), and to improve the waveform quality of the output signals SIGA to SIGC of the transmitter 10, which allows for improvement of the communication performance in the communication system 1.

Comparative Example

A transmitter 10R according to the present comparative example may have an output section 20R that omits the transition controller 30, the pre-driver 25D, and the driver section 26D from the transmitter section 20 according to the present embodiment. Any other configuration is similar to the configuration in the present embodiment (FIG. 1).

FIG. 14 illustrates an operation example of the output section 20R. In FIG. 14, (A) to (C) denote waveforms of the signals SIGA to SIGC, respectively; (D) to (I) denote waveforms of the signals PUA, PDA, PUB, PDB, PUC, and PDC, respectively; (J) denotes a waveform of the supply current Iac to be provided to the three pre-drivers 25A, 25B, and 25C; and (K) denotes a waveform of the supply voltage VDD1. FIG. 15 represents the number N1 of the transition signals among the three signals S21 to S23, and the number N3 of the transition signals among the six signals PUA, PDA, PUB, PDB, PUC, and PDC in each transition of the symbols.

For example, as illustrated in FIG. 14, when the symbol transitions from "+x" to "−y" at timing t11, the two signals PUA and PUC among the six signals PUA, PDA, PUB, PDB, PUC, and PDC may be made to transition (FIGS. 14 (D) to (I)).

Further, as illustrated in FIG. 14, when the symbol transitions from "−y" to "−z" at timing t12, the four signals PUA, PDB, PUC, and PDC among the six signals PUA, PDA, PUB, PDB, PUC, and PDC may be made to transition (FIGS. 14 (D) to (I)).

As described above, in the output section 20R according to the comparative example, the number N3 of the transition signals among the six signals PUA, PDA, PUB, PDB, PUC, and PDC may vary depending on the transition timing. Specifically, as represented in FIG. 15, the number N3 may become "2" or "4" depending on the transition. As a result, in the output section 20R, a magnitude of the supply current Iac to be provided to the three pre-drivers 25A, 25B, and 25C may vary depending on the transition timing, as illustrated in FIG. 14 (J). In other words, a magnitude of the supply current Iac may decrease in the symbol transition in which the number N3 is "2", and may increase in the symbol transition in which the number N3 is "4".

The supply current Iac may increase at the timing of driving the transistors MU and MD of the driver sections 26A to 26D. Each of these transistors MU and MD may be typically configured by a large-sized transistor, and therefore equivalent capacitances of the transistors MU and MD as seen from each gate of the transistors MU and MD may be large. Accordingly, the supply voltage VDD1 may be greatly fluctuated in driving the transistors MU and MD. At this time, in the output section 20R, a magnitude of the supply current Iac may vary depending on the transition timing, and thus low-frequency components may come to appear in the supply voltage VDD1 (FIG. 14 (K)), which may possibly cause the fluctuation in the supply voltage VDD1 to be further increased. The supply voltage VDD1 may be provided to the various circuits in the transmitter 10 (the clock generator 19, the signal generator 11, the flip-flops 12, and 21 to 23, and the output controller 24) in addition to the pre-drivers 25A to 25C. Therefore, when the fluctuation in the supply voltage VDD1 is thus great, for example, jitter may be generated in the output signals SIGA to SIGC of the transmitter 10R, which may possibly cause the waveform quality of the signals SIGA to SIGC to be deteriorated. In this case, it is likely that the communication performance in the communication system will be degraded.

In contrast, in the output section 20 according to the present embodiment, the number N2 of the transition signals among the eight signals PUA, PDA, PUB, PDB, PUC, PDC, PUD, and PDD is matched between the transition timings. As a result, the transmitter 10 makes it possible to suppress the fluctuation in the supply voltage VDD1, and to improve the waveform quality of the output signals SIGA to SIGC, which allows for improvement of the communication performance in the communication system 1.

Further, the transmitter 10 controls operation of the pre-driver section 25D on the basis of the signals S1 to S3 and the signals S21 to S23, which makes it possible to facilitate the timing design. In other words, for example, if a configuration is made in such a manner that the number of the transition signals among the six signals PUA, PDA, PUB, PDB, PUC, and PDC is directly detected, and the signals PUD and PDD are generated on the basis of such a detection result, the transition timing of the signals PUD and PDD may become slower than the transition timing of the signals PUA, PDA, PUB, PDB, PUC, and PDC due to delay in a circuit for generating the signals PUD and PDD, or any other reason. In this case, a magnitude of the supply current Iac may vary depending on the transition timing, which may possibly cause the fluctuation in the supply voltage VDD1 to be further increased.

In contrast, the transmitter 10 controls operation of the pre-driver section 25D on the basis of the signals S1 to S3, and the signals S21 to S23. In other words, when paying attention to the fact that there is a correlation between the number N1 of the transition signals among the three signals S21 to S23 and the number N3 of the transition signals among the six signals PUA, PDA, PUB, PDB, PUC, and PDC as represented in FIG. 15, the number N3 becomes "2" when the number N1 is "1", and therefore the signals PUD and PDD may be made to transition. Further, when the number N1 is "2" or "3", the number N3 becomes "4", and therefore the signals PUD and PDD may be retained. This allows the transmitter 10 to facilitate the timing design.

[Effects]

As described above, in the present embodiment, the number N2 of the transition signals among the eight signals PUA, PDA, PUB, PDB, PUC, PDC, PUD, and PDD is matched between the transition timings, which allows for improvement of the communication performance.

Modification Example 1-1

In the above-described embodiment, the pre-driver 25D is configured to drive the driver section 26D; however, the configuration is not limited thereto. Alternatively, capacitors may be driven as exemplified by an output section 20A illustrated in FIG. 16. The output section 20A may have a load section 27. The load section may have capacitors 271 and 272. An output signal of the pre-driver 251 of the pre-driver section 25D may be provided to a first end of the capacitor 271, and a second end thereof may be grounded. An output signal of the pre-driver 252 of the pre-driver section 25D may be provided to a first end of the capacitor 272, and a second end thereof may be grounded. A capacitance of the capacitor 271 may be equal to an equivalent capacitance of the transistor MU as seen from a gate of the transistor MU of each of the driver sections 26A to 26C, and a capacitance of the capacitor 272 may be equal to an equivalent capacitance of the transistor MU as seen from a gate of the transistor MD of each of the driver sections 26A to 26C. Even with such a configuration, it is possible to obtain the effects similar to those in the case of the above-described embodiment.

Modification Example 1-2

In the above-described embodiment, the transition controller 30 is configured to be operated at all times; however, the configuration is not limited thereto, and the transition controller 30 may be operated only when necessary. Hereinafter, a communication system 1B according to the present modification example is described in detail.

FIG. 17 illustrates a configuration example of the communication system 1B. The communication system 1B may determine whether or not the transition controller 30 is made to be operated on the basis of a result of transmission/reception of a predetermined pattern for calibration. The communication system 1B may include a receiver 40B and a transmitter 10B.

FIG. 18 illustrates a configuration example of the receiver 40B. The receiver 40B may have a pattern detector 47B. The pattern detector 47B may compare a pattern of a signal received by the receiver 40B with the predetermined pattern for calibration in a calibration mode, and provide the comparison result to the transmitter 10B as a signal DET.

FIG. 19 illustrates a configuration example of the transmitter 10B. FIG. 20 illustrates a configuration example of an output section 20B in the transmitter 10B. The output section 20B may have a transition controller 30B. The transition controller 30B may have two operation modes M1 and M2. In the operation mode M1, the transition controller 30B may operate in a similar manner to the case of the above-described embodiment. In the operation mode M2, the transition controller 30B may retain the respective signals PUD and PDD. The transition controller 30B may select one of the operation modes M1 and M2 depending on the signal DET to operate in the selected operation mode.

In the communication system 1B, in the calibration mode, at the start, the transmitter 10B may transmit the signals SIGA to SIGC having the predetermined pattern for calibration. Thereafter, the receiver 40B may receive the signals SIGA to SIGC, and the pattern detector 47B may compare a pattern of the received signal with the predetermined pattern for calibration, and notify the comparison result to the transmitter 10B. Afterward, the transition controller 30B of the transmitter 10B may select one of the operation modes M1 and M2 on the basis of the comparison result. Specifically, for example, in the event of a communication error in the calibration mode, the transition controller 20B may operate in the operation mode M1. This allows the communication system 1B to improve the communication quality, which makes it possible to reduce the possibility that a communication error will occur. When no communication error occurs in the calibration mode, the transition controller 20B may operate in the operation mode M2. As a result, the signals PUD and PDD are not made to transition, which allows the communication system 1B to reduce the power consumption.

Modification Example 1-3

In the above-described embodiment, the transmitter 10 carries out communication using the three signals SIGA to SIGC; however, the operation is not limited thereto. Hereinafter, a transmitter 10C according to the present modification example is described in detail.

FIG. 21 illustrates a configuration example of a communication system 1C with use of the transmitter 10C, and FIG. 22 illustrates a configuration example of a communication system 1D with use of the transmitter 10C. The transmitter 10C may have two operation modes N1 and N2. In the operation mode N1, as illustrated in FIG. 21, the transmitter 10C may provide signals SIG1A to SIG1C to a receiver 40C through data lanes DL1; may provide signals SIG2A to SIG2C to the receiver 40C through data lanes DL2; and may provide signals SIG3A to SIG3C to the receiver 40C through data lanes DL3. In the operation mode N2, as illustrated in FIG. 22, the transmitter 10C may transmit signals with use of five pairs of differential signals (channels CH1 to CH5). In such a manner, the transmitter 10C may transmit nine signals in the operation mode N1, and may transmit ten signals in the operation mode N2. At this time, in the operation mode N1, the transmitter 10C may not use the single pre-driver section and the single driver section for transmission.

The transmitter 10C may have a single transition controller 30. In the operation mode N1, the transition controller 30 may control the above-described pre-driver section that is not used for transmission on the basis of, for example, signals S1 to S3 and signals S21 to S23 that are related to the data lanes DL1. This allows the transmitter 10C to suppress the fluctuation in the supply voltage VDD1, as with the case of the above-described embodiment.

It is to be noted that, in this example, the transition controller 30 operates on the basis of the signals S1 to S3 and the signals S21 to S23 that are related to the data lanes DL1; however, the operation is not limited thereto. As an alternative, for example, the transition controller 30 may operate on the basis of signals S1 to S3 and signals S21 to S23 that are related to the data lanes DL2, or may operate on the basis of signals S1 to S3 and signals S21 to S23 that are related to the data lanes DL3.

Other Modification Examples

Further, two or more of the above-described modification examples may be combined.

2. Second Embodiment

Next, the description is provided on a communication system 2 according to a second embodiment. The present embodiment may configure a transmitter 50 with use of a transition controller that controls operation of a pre-driver section 25D on the basis of signals TxF and TxP. It is to be noted that any component parts essentially same as those in the communication system 1 according to the above-described first embodiment are denoted with the same reference numerals, and the related descriptions are omitted as appropriate.

FIG. 23 illustrates a configuration example of the transmitter 50. The transmitter 50 may have an output section 60. The output section 60 may generate and output signals SIGA to SIGC on the basis of the signals S1 to S3, the signals TxF and TxP, as well as the clock TxCK.

FIG. 24 illustrates a configuration example of the output section 60. The output section 60 may include the output controller 24, a delay section 61, a transition controller 70, the pre-drivers 25A to 25D, and the driver section 26D.

The output controller 24 may generate the six signals PUA, PDA, PUB, PDB, PUC, and PDC on the basis of the signals S1 to S3 and the clock TxCK, as with the case of the above-described first embodiment.

The delay section 61 may delay the signals TxF and TxP by a predetermined amount to output these delayed signals as signals TxF2 and TxP2, respectively. The delay amount in the delay section 61 may correspond to the delay amount in the signal generator 11 that generates the signals S1 to S3 that are inputted to the output controller 24 on the basis of the signals TxF, TxR, and TxP.

The transition controller 70 may generate the two signals PUD and PDD on the basis of the signals TxF2 and TxP2. Specifically, as described later, the transition controller 70 may make the signals PUD and PDD transition on the basis of the signals TxF2 and TxP2.

FIG. 25 illustrates a configuration example of the transition controller 70. The transition controller 70 may include an OR circuit 71, the flip-flop 38, and the selector 39. The OR circuit 71 may determine a logical sum of the signal TxF2 and an inverted signal of the signal TxP2 to output the result as a signal SEL. As with the transition controller 30 (FIG. 8) according to the above-described first embodiment, the circuit including the flip-flop 38 and the selector 39 may retain respective logic levels of the signals PUD and PDD when the signal SEL is "1", and may invert the respective logic levels of the signals PUD and PDD when the signal SEL is "0".

Here, the output controller 24 corresponds to a specific example of a "first controller" in the disclosure. The transition controller 70 corresponds to a specific example of a "second controller" in the disclosure.

FIG. 26 represents an operation example of the transition controller 70. In FIG. 26, a "round mark" indicates that the relevant signal may transition, and a blank column indicates that the relevant signal may not transition. For example, if the signal TxF is "0", and the signal TxP is "1", the signal SEL may become "0", and the signals PUD and PDD may be made to transition. Otherwise, the signal SEL may become "1", and the signals PUD and PDD may not be made to transition.

In FIG. 24, transitions in which the signal TxF is "0", and the signal TxP is "1" are indicated with dashed lines. Specifically, the transitions in which the signal TxF is "0", and the signal TxP is "1" may include transition between the symbol "+x" and the symbol "−y", transition between the symbol "+x" and the symbol "−z", transition between the symbol "+y" and the symbol "−x", transition between the symbol "+y" and the symbol "−z", transition between the symbol "+z" and the symbol "−x", and transition between the symbol "+z" and the symbol "−y". These transitions may correspond to a case where the number N3 of the transition signals among the six signals PUA, PDA, PUB, PDB, PUC, and PDC become "2". Accordingly, when such a symbol transition takes place, the transition controller 70 may make the signals PUD and PDD transition. This makes it possible to set the number N2 of the transition signals among the eight signals PUA, PDA, PUB, PDB, PUC, PDC, PUD, and PDD at "4", which allows the number N2 to be matched between the transition timings. As a result, the transmitter 50 makes it possible to suppress the fluctuation in the supply voltage VDD1, and to improve the waveform quality of the output signals SIGA to SIGC, which allows for improvement of the communication performance in the communication system 2.

As described above, also in a manner of controlling operation of the pre-driver section 25D on the basis of the signals TxF and TxP, it is possible to achieve the effects similar to those in the case of the above-described first embodiment.

Modification Example 2

Each of the modification examples in the above-described first embodiment may be applied to the communication system 2 according to the above-described second embodiment.

3. Application Examples

Next, the description is provided on application examples of the communication system described in any of the above-described embodiments and modification examples thereof.

FIG. 27 illustrates an external view of a smartphone 300 (multifunctional mobile phone) to which the communication system according to any of the above-described embodiments and the like is applied. A variety of devices are built into this smartphone 300, and the communication system according to any of the above-described embodiments and the like is applied in a communication system in which data communication is made among these devices.

FIG. 28 illustrates a configuration example of an application processor 310 to be used in the smartphone 300. The application processor 310 has a CPU (Central Processing Unit) 311, a memory controller 312, a power supply controller 313, an external interface 314, a GPU (Graphics Processing Unit) 315, a media processor 316, a display controller 317, and an MIPI (Mobile Industry Processor Interface) interface 318. In this example, the CPU 311, the memory controller 312, the power supply controller 313, the external interface 314, the GPU 315, the media processor 316, and the display controller 317 are coupled to a system bus 319, and data communication is allowed to be performed among these sections via this system bus 319.

The CPU 311 processes various information to be handled in the smartphone 300 in accordance with programs. The memory controller 312 controls a memory 501 to be used by the CPU 311 for information processing operation. The power supply controller 313 controls a power supply of the smartphone 300.

The external interface 314 is an interface for communication with external devices, and may be coupled to a wireless communicator 502 and an image sensor 410 in this example. The wireless communicator 502 performs wireless communication with mobile phone base stations, and may include, for example, a baseband section, an RF (Radio Frequency) front-end section, or any other section. The image sensor 410 acquires images, and may include, for example, a CMOS sensor.

The GPU 315 carries out image processing operation. The media processor 316 processes information such as sound, characters, and graphics. The display controller 317 controls a display 504 via the MIPI interface 318. The MIPI interface 318 transmits image signals to the display 504. As such image signals, for example, YUV format, RGB format, and other format signals may be used. For example, the communication system according to any of the above-described embodiments and the like may be applied to a communication system between the MIPI interface 318 and the display 504.

FIG. 29 illustrates a configuration example of the image sensor 410. The image sensor 410 has a sensor 411, an ISP (Image Signal Processor) 412, a JPEG (Joint Photographic Experts Group) encoder 413, a CPU 414, a RAM (Random Access Memory) 415, a ROM (Read Only Memory) 416, a power supply controller 417, an I$^2$C (Inter-Integrated Circuit) interface 418, and an MIPI interface 419. In this example, each of these blocks may be coupled to a system bus 420, and data communication is allowed to be performed among these blocks via this system bus 420.

The sensor 411 acquires images, and may include, for example, a CMOS sensor. The ISP 412 performs predetermined processing operation for the images acquired by the sensor 411. The JPEG encoder 413 encodes the images processed by the ISP 412 to generate JPEG-format images. The CPU 414 controls each block of the image sensor 410 in accordance with programs. The RAM 415 is a memory to be used by the CPU 414 for information processing operation. The ROM 416 stores programs to be executed in the CPU 414. The power supply controller 417 controls a power supply of the image sensor 410. The I$^2$C interface 418 receives control signals from the application processor 310. Further, the image sensor 410 also receives clock signals from the application processor 310 in addition to the control signals (this is not illustrated). Specifically, the image sensor 410 is configured to be able to operate on the basis of clock signals at various frequencies. The MIPI interface 419 transmits image signals to the application processor 310. As such image signals, for example, YUV format, RGB format, and other format signals may be used. For example, the communication system according to any of the above-described embodiments and the like may be applied to a communication system between the MIPI interface 419 and the application processor 310.

The technology is described thus far with reference to some embodiments and modification examples, as well as examples of application to electronic apparatuses; however, the technology is not limited to the above-described embodiments and the like, but various modifications may be made.

For example, in each of the above-described embodiments and the like, the communication is performed using the three signals SIGA, SIGB, and SIGC; however, the operation is not limited thereto. Alternatively, for example, the communication may be performed using two signals, or the communication may be performed using four or more signals.

Further, for example, in each of the above-described embodiments and the like, when a voltage of an output terminal is set at the medium-level voltage VM, both of the transistors MU and MD are turned off; however, the operation is not limited thereto. Alternatively, both of the transistors MU and MD may be turned on. This achieves Thevenin termination, which makes it possible to set a voltage of the output terminal at the medium-level voltage VM.

It is to be noted that the effects described herein are merely exemplified and non-limiting, and effects of the disclosure may be other effects, or may further include other effects.

It is to be noted that the technology may be configured as follows.

(1) A transmitter including:
  three first driver sections;
  three first pre-driver sections that are provided corresponding to the respective three first driver sections, and each drive corresponding one of the first driver sections on a basis of corresponding one of three first control signals, the three first control signals being different from one another and each including predetermined number of signals;
  a second pre-driver section that operates on a basis of a second control signal, the second control signal including predetermined number of signals; and
  a controller that controls transition of the predetermined number of signals included in the second control signal to allow number of signals to be subjected to the transition out of the plurality of signals included in the three first control signals and the plurality of signals included in the second control signal to be same between timings of the transition.

(2) The transmitter according to (1), wherein the controller includes:
  a first controller that generates the three first control signals on a basis of a data signal; and
  a second controller that generates the second control signal on a basis of transition of the data signal.

(3) The transmitter according to (2), wherein
  the data signal includes three signals, and
  number of signals to be subjected to the transition out of the three signals included in the data signal corresponds to the number of signals to be subjected to the transition out of the plurality of signals included in the three first control signals.

(4) The transmitter according to (1), further including a data signal generator that generates, on a basis of a transition signal that indicates transition between transmission symbols, a data signal indicating a sequence of the transmission symbols,
  wherein the controller includes:
  a first controller that generates the three first control signals on a basis of the data signal; and
  a second controller that generates the second control signal on a basis of the transition signal.

(5) The transmitter according to (4), wherein the transition signal corresponds to the number of signals to be subjected to the transition out of the plurality of signals included in the three first control signals.

(6) The transmitter according to any one of (1) to (5), wherein
  each of the first control signals includes two signals, and
  the second control signal includes two signals.

(7) The transmitter according to (6), wherein the number of signals to be subjected to the transition out of the six signals included in the three first control signals is two or four.

(8) The transmitter according to (7), wherein the number of signals to be subjected to the transition out of the eight signals included in the three first control signals and the second control signal is four.

(9) The transmitter according to any one of (1) to (8), wherein
  the transmitter includes a first operation mode and a second operation mode, and
  the controller controls, in the first operation mode, the transition of the predetermined number of signals included in the second control signal to allow the number of signals to be subjected to the transition out of the plurality of signals included in the three first control signals and the plurality of signals included in the second control signal to be the same between the timings of the transition.

(10) The transmitter according to (9), further including a second driver section, wherein the second pre-driver section drives the second driver section, and the second driver section outputs a signal in the second operation mode.

(11) The transmitter according to any one of (1) to (10), wherein each of the three first driver sections includes
  an output terminal,
  a first transistor having a gate, a drain led to a first power supply, and a source led to the output terminal, and
  a second transistor having a gate, a drain led to the output terminal, and a source led to a second power supply, and
  wherein each of the three first pre-driver sections includes
  a first pre-driver that drives the gate of the first transistor provided in the first driver section that corresponds to relevant one of the first pre-driver sections, and
  a second pre-driver that drives the gate of the second transistor provided in the first driver section that corresponds to relevant one of the first pre-driver sections.

(12) The transmitter according to any one of (1) to (9), further including a third driver section that includes:
  a first transistor having a gate, a drain led to a first power supply, and a source; and
  a second transistor having a gate, a drain led to the source of the first transistor, and a source led to a second power supply, and
  the second pre-driver section drives the third driver section.

(13) The transmitter according to any one of (1) to (9), further including a capacitor section, wherein the second pre-driver section drives the capacitor section.

(14) A transmitter including:
  a plurality of first driver sections;
  a plurality of first pre-driver sections that are provided corresponding to the respective first driver sections, and each drive corresponding one of the first driver sections on a basis of corresponding one of first control signals, the first control signals being different from one another and each including predetermined number of signals;
  a second pre-driver section that operates on a basis of a second control signal, the second control signal including predetermined number of signals; and
  a controller that controls transition of the predetermined number of signals included in the second control signal to allow number of signals to be subjected to the transition out of the plurality of signals included in the first control signals and the plurality of signals included in the second control signal to be same between timings of the transition.

(15) A communication system with a transmitter and a receiver, the transmitter including:
three first driver sections;
three first pre-driver sections that are provided corresponding to the respective three first driver sections, and each drive corresponding one of the first driver sections on a basis of corresponding one of three first control signals, the three first control signals being different from one another and each including predetermined number of signals;
a second pre-driver section that operates on a basis of a second control signal, the second control signal including predetermined number of signals; and
a controller that controls transition of the predetermined number of signals included in the second control signal to allow number of signals to be subjected to the transition out of the plurality of signals included in the three first control signals and the plurality of signals included in the second control signal to be same between timings of the transition.

(16) The communication system according to (15),
wherein the receiver includes:
a receiver section that receives signals to be transmitted from the three respective driver sections; and
a detector that generates, on a basis of the signals received by the receiver section, a detection signal indicating communication status, and
wherein the controller controls, on a basis of the detection signal, the transition of the predetermined number of signals included in the second control signal.

This application claims the benefit of Japanese Priority Patent Application No. 2014-211464 filed with Japan Patent Office on Oct. 16, 2014, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A transmitter comprising:
three first driver sections;
three first pre-driver sections that are provided corresponding to the respective three first driver sections, each pre-driver section corresponding to one of the three first driver sections on a basis of corresponding one of three first control signals, the three first control signals being different from one another and each including predetermined number of signals;
a second pre-driver section that operates on a basis of a second control signal, the second control signal including predetermined number of signals; and
a controller that controls transition of the predetermined number of signals included in the second control signal to allow number of signals to be subjected to the transition out of a plurality of signals included in the three first control signals and a plurality of signals included in the second control signal to be same between timings of the transition.

2. The transmitter according to claim 1, wherein the controller includes:
a first controller that generates the three first control signals on a basis of data signals: and
a second controller that generates the second control signal on a basis of transition of the data signals.

3. The transmitter according to claim 2, wherein
the data signals include three signals, and
number of signals to be subjected to the transition out of the three signals included in the data signals corresponds to the number of signals to be subjected to the transition out of the plurality of signals included in the three first control signals.

4. The transmitter according to claim 1, further comprising a data signal generator that generates, on a basis of a transition signal that indicates transition between transmission symbols, data signals indicating a sequence of the transmission symbols,
wherein the controller includes:
a first controller that generates the three first control signals on a basis of the data signals; and
a second controller that generates the second control signal on the basis of the transition signal.

5. The transmitter according to claim 4, wherein the transition signal corresponds to the number of signals to be subjected to the transition out of the plurality of signals included in the three first control signals.

6. The transmitter according to claim 1, wherein
each of the three first control signals includes two signals, and
the second control signal includes two signals.

7. The transmitter according to claim 6, wherein the number of signals to be subjected to the transition out of the six signals included in the three first control signals is two or four.

8. The transmitter according to claim 7, wherein the number of signals to be subjected to the transition out of the eight signals included in the three first control signals and the second control signal is four.

9. The transmitter according to claim 1, wherein
the transmitter includes a first operation mode and a second operation mode, and
the controller controls, in the first operation mode, the transition of the predetermined number of signals included in the second control signal to allow the number of signals to be subjected to the transition out of the plurality of signals included in the three first control signals and the plurality of signals included in the second control signal to be the same between the timings of the transition.

10. The transmitter according to claim 9, further comprising a second driver section, wherein the second pre-driver section drives the second driver section, and the second driver section outputs a signal in the second operation mode.

11. The transmitter according to claim 1,
wherein each of the three first driver sections includes
an output terminal,
a first transistor having a gate, a drain led to a first power supply, and a source led to the output terminal, and
a second transistor having a gate, a drain led to the output terminal, and a source led to a second power supply, and
wherein each of the three first pre-driver sections includes
a first pre-driver that drives the gate of the first transistor provided in one of the three first driver sections that corresponds to relevant one of the three first pre-driver sections, and a second pre-driver that drives the gate of the second transistor provided in the one of the three first driver sections that corresponds to relevant one of the three first pre-driver sections.

12. The transmitter according to claim 1, further comprising a second driver section that includes:
a first transistor having a gate, a drain led to a first power supply, and a source; and
a second transistor having a gate, a drain led to the source of the first transistor, and a source led to a second power supply, and
the second pre-driver section drives the second driver section.

13. The transmitter according to claim 1, further comprising a load section including at least one capacitor, wherein the second pre-driver section drives the load section.

14. A transmitter comprising:
a plurality of first driver sections;
a plurality of first pre-driver sections that are provided corresponding to the respective first driver sections, each pre-driver section corresponding to one of the first driver sections on a basis of corresponding one of first control signals, the first control signals being different from one another and each including predetermined number of signals;
a second pre-driver section that operates on a basis of a second control signal, the second control signal including predetermined number of signals; and
a controller that controls transition of the predetermined number of signals included in the second control signal to allow number of signals to be subjected to the transition out of a plurality of signals included in the first control signals and a plurality of signals included in the second control signal to be same between timings of the transition.

15. A communication system with including a transmitter and a receiver, the transmitter comprising:
three first driver sections;
three first pre-driver sections that are provided corresponding to the respective three first driver sections, each pre-driver section corresponding to one of the three first driver sections on a basis of corresponding one of three first control signals, the three first control signals being different from one another and each including predetermined number of signals;
a second pre-driver section that operates on a basis of a second control signal, the second control signal including predetermined number of signals; and
a controller that controls transition of the predetermined number of signals included in the second control signal to allow number of signals to be subjected to the transition out of a plurality of signals included in the three first control signals and a plurality of signals included in the second control signal to be same between timings of the transition.

16. The communication system according to claim 15, wherein the receiver includes:
a receiver section that receives signals to be transmitted from the three respective first driver sections; and
a detector that generates, on a basis of the signals received by the receiver section, a detection signal indicating communication status, and
wherein the controller controls, on a basis of the detection signal, the transition of the predetermined number of signals included in the second control signal.

* * * * *